(12) United States Patent (10) Patent No.: US 9,076,916 B2
Kobayashi (45) Date of Patent: Jul. 7, 2015

(54) METHOD AND DEVICE FOR MANUFACTURING SEMICONDUCTOR DEVICES, SEMICONDUCTOR DEVICE AND TRANSFER MEMBER

(75) Inventor: Hikaru Kobayashi, Kyoto (JP)

(73) Assignee: Hikaru Kobayashi, Kyoto (JP)

( * ) Notice: Subject to any disclaimer, the term of this patent is extended or adjusted under 35 U.S.C. 154(b) by 0 days.

(21) Appl. No.: 13/578,967

(22) PCT Filed: Feb. 14, 2011

(86) PCT No.: PCT/JP2011/052980
§ 371 (c)(1),
(2), (4) Date: Aug. 14, 2012

(87) PCT Pub. No.: WO2011/099594
PCT Pub. Date: Aug. 18, 2011

(65) Prior Publication Data
US 2012/0326255 A1 Dec. 27, 2012

(30) Foreign Application Priority Data

Feb. 15, 2010 (JP) .................................. 2010-029643
Dec. 8, 2010 (JP) ..................... PCT/JP2010/071966

(51) Int. Cl.
| H01L 21/461 | (2006.01) |
| H01L 21/46 | (2006.01) |
| H01L 27/14 | (2006.01) |
| H01L 31/0747 | (2012.01) |
| H01L 31/0236 | (2006.01) |
| H01L 31/18 | (2006.01) |

(52) U.S. Cl.
CPC .............. *H01L 31/0747* (2013.01); *Y10T 29/41* (2015.01); *Y10T 442/10* (2015.04); *H01L 31/02363* (2013.01); *H01L 31/182* (2013.01); *Y02E 10/546* (2013.01)

(58) Field of Classification Search
CPC ..................... H01L 21/30612; H01L 21/3081; H01L 21/0332; H01L 33/30; H01L 33/18
USPC ............ 438/57, 745, 455; 257/431, E31.032; 118/52, 320, 323; 427/240, 427.3
See application file for complete search history.

(56) References Cited

U.S. PATENT DOCUMENTS

| 2002/0074314 A1* | 6/2002 | Bohn et al. ........................ 216/56 |
| 2008/0011228 A1* | 1/2008 | Inoue et al. .................... 118/400 |
| 2008/0073222 A1* | 3/2008 | Yamauchi et al. ............. 205/655 |

FOREIGN PATENT DOCUMENTS

| CN | 1545728 A | 11/2004 |
| JP | 2000-195835 A | 7/2000 |

(Continued)

OTHER PUBLICATIONS

Li et al Metal-assisted chemical etching in HF H2O2 produces porous silicon APL vol. 77 No. 16, Oct. 16, 2000 pp. 2572-2574.*

(Continued)

*Primary Examiner* — Julio J Maldonado
*Assistant Examiner* — Moazzam Hossain
(74) *Attorney, Agent, or Firm* — Seed IP Law Group PLLC

(57) ABSTRACT

Disclosed is a method for manufacturing semiconductor devices. Said method includes: a supply step in which a process liquid (19) that oxidizes and dissolves a target substrate (20) to be treated is supplied to the surface of said substrate (20) to be treated; a positioning step in which a mesh-like transferring member (10b) provided with a catalyst material is positioned near or in contact with the surface of the substrate (20) to be treated; and a concave or convex forming step in which a concave or convex is formed on the surface of the substrate (20) to be treated via the aforementioned supply and positioning steps. As opposed to existing manufacturing methods, which manufacture semiconductor devices provided with semiconductor substrates with highly arbitrary (i.e. not very reproducible) concaves or convexes, by forming an appropriate concave or convex or mesh at the transferring member step, the disclosed method can stably manufacture semiconductor devices provided with semiconductor substrates that have concaves or convexes of a fixed level.

20 Claims, 13 Drawing Sheets

(56) References Cited

FOREIGN PATENT DOCUMENTS

| JP | 2006-114632 A | 4/2006 |
|---|---|---|
| WO | 2005/059985 A1 | 6/2005 |
| WO | 2007/049494 A1 | 5/2007 |

OTHER PUBLICATIONS

Fukushima et al., "Fabrication of Low Reflectivity Poly-Crystalline Si Surfaces by Structure Transfer Method," Electrochemical and Solid-State Letters 14:(2), B13-B15, Nov. 18, 2010.

Tsujino et al., "Texturization of multicrystalline silicon wafers for solar cells by chemical treatment using metallic catalyst," Solar Energy Materials and Solar Cells 90:(1), Jan. 6, 2006, pp. 100-110.
International Search Report, mailed May 24, 2011, for PCT/JP2011/052980, 4 pages.
Office Action, mailed Oct. 10, 2014, for CN201180009088.8, 10 pages.
Office Action, mailed Sep. 2, 2014, for JP2011-553908, 10 pages.
Fukushima et al., "Fabrication of Low Reflectivity Poly-Crystalline Si Surfaces by Structure Transfer Method," Electrochemical and Solid-State Letters 14(2):B13-B15, 2011, 4 pages.
Office Action, mailed Sep. 2, 2014, for JP2011-553908, 6 pages.

* cited by examiner

Fig.2G
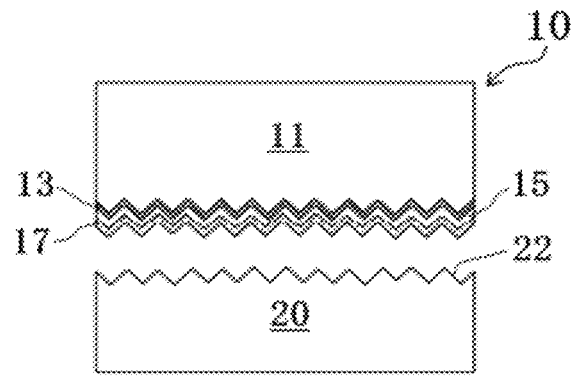
Fig.3
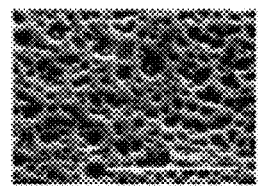
Fig.4
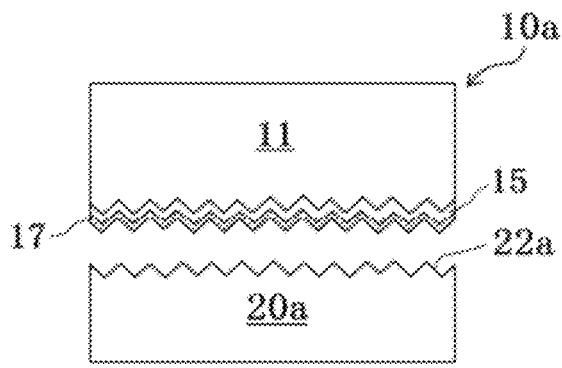
[Fig.5]
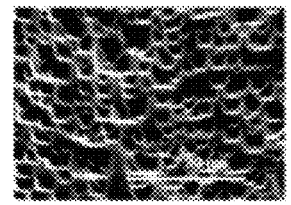

METHOD AND DEVICE FOR MANUFACTURING SEMICONDUCTOR DEVICES, SEMICONDUCTOR DEVICE AND TRANSFER MEMBER

TECHNICAL FIELD

The present invention relates to a method of manufacturing a semiconductor device, an apparatus for manufacturing the semiconductor device, a semiconductor device and a transferring member.

BACKGROUND ART

In crystalline solar cells, hitherto, attempts to improve energy conversion efficiency by using so-called "optical confinement effect" through converting a flat surface of a silicon substrate to a surface concaved or convexed are made. In this approach, since light reflected once on an inclined surface of the concave and convex is received and taken at the adjacent inclined surface of the concave and convex as distinct from a substrate with a flat surface, the reflectance at the surface can be substantially reduced. As a result of this, since overall quantity of incident light increases, conversion efficiency is increased.

As a method of forming the above-mentioned concave and convex structure, for example, there is proposed a method of immersing a silicon substrate into a catalytic metal ion-containing mixed aqueous solution of an oxidizing agent and hydrofluoric acid (Patent Document 1). It is disclosed that in accordance with this method, a porous silicon layer can be formed on the surface of the substrate.

PRIOR ART DOCUMENTS

Patent Documents

Patent Document 1: JP2005-183505A

DISCLOSURE OF THE INVENTION

Problems to be Solved by the Invention

However, it cannot be said that the above-mentioned method of forming a concave and convex structure has sufficient controllability of formation of a concave and convex shape. Specifically, it is believed that in the above method, first, a metal on the surface of the silicon substrate is deposited at the surface of the silicon substrate and thereby the metal acts as a decomposition catalyst. Then, since a position or a distribution of metal deposition cannot be freely controlled, it is extremely difficult to ensure the uniformity of a size or distribution of the formed concaves and convexes, and reproducibility thereof is poor. Moreover, it is difficult to eliminate metal after preparing a concave and convex structure of the surface.

In addition, the study and development of specific means for forming such uniform concaves and convexes in consideration of the industrial ability or the mass production ability respond to requests of industry.

Solutions to the Problems

The present invention realizes a surface concaved or convexed, which is excellent in an industrial ability or a mass production ability and is high in uniformity and repeatability, on a semiconductor substrate by solving at least one of the above-mentioned technical problems. As a result of this, the present invention significantly contributes to stable advances in performance of various semiconductor devices typified by solar cells and the industrial realization of these semiconductor devices.

One method of the present invention for manufacturing a semiconductor device comprises a supply step of supplying a process liquid that oxidizes and dissolves a semiconductor substrate onto the surface of the semiconductor substrate, a locating step of locating a mesh-like transferring member including a catalyst material at a position in contact with or close to the surface of the semiconductor substrate, and a concave and convex forming step of forming the surface concaved or convexed through the supply step and the locating step.

According to the method for manufacturing a semiconductor device, since concaves and convexes of the semiconductor substrate to be subjected to treatment are formed based on a mesh configuration which the transferring member has, a semiconductor device, which includes the semiconductor substrate having concaves and convexes reflecting the mesh configuration of the transferring member, so to speak, as a die or a mold, is attained. That is, it is possible to manufacture stably a semiconductor device including not a semiconductor substrate having highly random, in other words, poorly-reproducible concaves and convexes like conventional concaves and convexes, but a semiconductor substrate having a certain level of a concave and convex shape by forming a proper mesh configuration at a stage of the transferring member.

Another method of the present invention for manufacturing a semiconductor device comprises a supply step of supplying a process liquid that oxidizes and dissolves a semiconductor substrate onto the surface of the semiconductor substrate, a locating step of locating a transferring member including a catalyst material on the surface concaved or convexed or above the surface concaved or convexed at a position in contact with or close to the surface of the semiconductor substrate, and a concave and convex forming step of forming the surface concaved or convexed of the semiconductor substrate through the supply step and the locating step.

According to the method for manufacturing a semiconductor device, since concaves and convexes of the semiconductor substrate to be subjected to treatment are formed based on a concave and convex shape which the transferring member has, a semiconductor device, which includes the semiconductor substrate having concaves and convexes reflecting the concave and convex shape of the transferring member, so to speak, as a die or a mold, is attained. That is, it is possible to manufacture stably a semiconductor device including not a semiconductor substrate having highly random, in other words, poorly-reproducible concaves and convexes like conventional concaves and convexes, but a semiconductor substrate having a certain level of a concave and convex shape by forming a proper concave and convex shape at a stage of the transferring member.

Further, a manufacturing apparatus of a semiconductor device, which is one of the present invention, comprises a supply unit for supplying a process liquid that oxidizes and dissolves a semiconductor substrate onto the surface of the semiconductor substrate, and a locating unit for locating a mesh-like transferring member including a catalyst material at a position in contact with or close to the surface.

According to the manufacturing apparatus of a semiconductor device, since concaves and convexes of the semiconductor substrate to be subjected to treatment are formed based on a mesh configuration which the transferring member has, a semiconductor device, which includes the semiconductor substrate having concaves and convexes reflecting the mesh configuration of the transferring member, so to speak, as a die or a mold, can be manufactured. That is, it is possible to manufacture stably a semiconductor device including not a semiconductor substrate having highly random, in other words, poorly-reproducible concaves and convexes like conventional concaves and convexes, but a semiconductor substrate having a certain level of a concave and convex shape by forming a proper mesh configuration at a stage of the transferring member.

Further, a manufacturing apparatus of a semiconductor device, which is another one of the present invention, comprises a supply unit for supplying a process liquid that oxidizes and dissolves a semiconductor substrate onto the surface of the semiconductor substrate, and a locating unit for locating a transferring member including a catalyst material on the surface concaved or convexed or above the surface concaved or convexed at a position in contact with or close to the surface of the semiconductor substrate.

According to the manufacturing apparatus of a semiconductor device, since concaves and convexes of the semiconductor substrate to be subjected to treatment are formed based on a concave and convex shape which the transferring member has, a semiconductor device, which includes the semiconductor substrate having concaves and convexes reflecting the concave and convex shape of the transferring member, so to speak, as a die or a mold, can be manufactured. That is, it is possible to manufacture stably a semiconductor device including not a semiconductor substrate having highly random, in other words, poorly-reproducible concaves and convexes like conventional concaves and convexes, but a semiconductor substrate having a certain level of a concave and convex shape by forming a proper concave and convex shape at a stage of the transferring member.

Further, a transferring member, one of the present invention, is a mesh-like member including a catalyst material, and the transferring member converts the surface of a semiconductor substrate to a surface having a concave and convex shape by locating the catalyst material at a position in contact with or close to the surface of the semiconductor substrate in a state in which a process liquid having an oxidizing property and a dissolving property exists on the surface of the semiconductor substrate.

According to the transferring member, since concaves and convexes of the semiconductor substrate to be subjected to treatment are formed based on a mesh structure which the transferring member has, it is possible to supply stably the semiconductor substrate having concaves and convexes reflecting the mesh structure of the transferring member, so to speak, as a die or a mold.

Further, a transferring member, another one of the present invention, includes a catalyst material on the surface concaved or convexed or above the surface concaved or convexed, and the transferring member converts the surface of a semiconductor substrate to a surface having a concave and convex shape by locating the catalyst material at a position in contact with or close to the surface of the semiconductor substrate in a state in which a process liquid having an oxidizing property and a dissolving property exists on the surface of the semiconductor substrate.

According to the transferring member, since concaves and convexes of the semiconductor substrate to be subjected to treatment are formed based on a concave and convex shape which the transferring member has, it is possible to supply stably the semiconductor substrate having concaves and convexes reflecting the concave and convex shape of the transferring member, so to speak, as a die or a mold.

Further, a semiconductor device, one of the present invention, is a semiconductor device in which a surface of a semiconductor substrate without an electrode formed thereon has a porous concave and convex shape formed in a state in which a process liquid that oxidizes and dissolves a semiconductor substrate is introduced onto the surface of the semiconductor substrate and a mesh-like transferring member including a catalyst material is in contact with or close to the surface.

According to the semiconductor device, since concaves and convexes of the semiconductor substrate to be subjected to treatment are formed based on a mesh configuration which the transferring member has, a semiconductor device including the semiconductor substrate having concaves and convexes reflecting the mesh configuration of the transferring member, so to speak, as a die or a mold, is formed. That is, it is possible to attain a semiconductor device including not a semiconductor substrate having highly random, in other words, poorly-reproducible concaves and convexes like conventional concaves and convexes, but a semiconductor substrate having a certain level of a concave and convex shape by forming a proper mesh configuration at a stage of the transferring member.

Further, in the above-mentioned inventions, the transferring member is preferably made of a material resistant (typically, etching resistance or insolubility) to a process liquid having an oxidizing property and a dissolving property in forming concaves and convexes of the surface of the semiconductor substrate by liberating such a process liquid to the semiconductor substrate to be subjected to treatment. The transferring member is not particularly limited, and a crystalline semiconductor substrate or a member having a mesh structure can be employed as a transferring member. In addition, concaves and convexes in the transferring member are not limited to the case where the concaves and convexes are formed by using wet chemical etching. For example, a fine concave and convex shape formed by isotropic or anisotropic dry etching or nanoimprinting, based on a semiconductor technology or a MEMS technology, can be applied.

Further, in the above-mentioned inventions, the mesh-like member is not limited to the case where a member is formed in the form of intersecting vertical line and horizontal line (for example, net-like), typified by FIG. 9. The mesh-like member includes a configuration or a structure of only a vertical line or only a horizontal line, and a configuration or a structure in which only a vertical line or only a horizontal line exists in one region and a vertical line and a horizontal line intersect with each other in the other region.

The present inventor assumes a mechanism which forms concaves and convexes of the semiconductor substrate to be as follows. First, when a surface concaved or convexed at the surface of the transferring member or a catalyst material existing on the mesh structure is brought into contact with the surface of the semiconductor substrate, the catalyst material acts as a cathode of an electrochemical reaction and a decomposition reaction of an oxidizing agent occurs at the surface of the catalyst material. On the other hand, an anode reaction occurs at the surface of a silicon surface. As a highly potential anode reaction, the following reaction formula is conceivable.

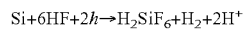

$$Si + 6HF + 2h \rightarrow H_2SiF_6 + H_2 + 2H^+ \qquad \text{[Chem. 1]}$$

It is thought that for example, in the case where the above-mentioned mesh-like transferring member is employed, the silicon surface is dissolved by the above anode reaction to form a porous silicon. More specifically, the present inventor assumes that since hydrogen ions (H+) are produced by the above reaction, equilibrium shifts to the right side by increasing a pH, that is, by making the reaction alkaline, and therefore a reaction of forming a porous silicon proceeds. That is, addition of alkali can promote a reaction of forming a porous silicon. Further, if a catalyst material acts as a decomposition catalyst of the oxidizing agent in the process liquid at the surface of the semiconductor substrate, an atomic oxygen produced from the oxidizing agent oxidizes the surface of the semiconductor substrate. Then, an oxide layer of the oxidized site is dissolved by a dissolving agent, and therefore the surface of the semiconductor is substantially etched. Oxidation of the surface of the semiconductor substrate and dissolution of the surface of the semiconductor substrate in the process liquid are repeated, and a concave and convex shape substantially reflecting the configuration of the surface of the transferring member, in other words, a concave and convex shape, in which the configuration of the surface of the transferring member is reversed, is probably formed. Therefore, in the above-mentioned inventions, the catalyst material is not particularly limited as long as it acts as a decomposition catalyst of the oxidizing agent in the above-mentioned process liquid. Daresaying, typical preferred examples of the catalyst material include at least one selected from the group consisting of platinum (Pt), silver (Ag), palladium (Pd), gold (Au), rhodium (Rh) and alloys containing these metals.

In the present application, "the transferring member includes the catalyst material" is a concept including a state in which a film or a layer of the catalyst material is formed on the surface of the transferring member, and a state in which the catalyst material adheres onto the surface of the transferring member in the form of a particle or an island, and including various aspects in which the catalyst material on the transferring member can develop a function or performance as a catalyst. Moreover, the meaning of "a transferring member includes a catalyst material" includes an aspect in which even though the transferring member itself can contain unavoidable impurities, transferring member is composed of only the catalyst material. In addition, a typical aspect of such a catalyst material is a film formed by a publicly known sputtering method, a vapor-deposited film by a CVD method or the like, or a film formed by plating, but the catalyst material is not limited to these films.

Effects of the Invention

According to the method for manufacturing a semiconductor device, one of the present invention, since concaves and convexes of the semiconductor substrate to be subjected to treatment are formed based on a concave and convex shape or a mesh configuration which the transferring member has, a semiconductor device, which includes the semiconductor substrate having concaves and convexes reflecting the concave and convex shape or the mesh configuration of the transferring member, so to speak, as a die or a mold, is attained. That is, it is possible to manufacture stably a semiconductor device including not a semiconductor substrate having highly random, in other words, poorly-reproducible concaves and convexes like conventional concaves and convexes, but a semiconductor substrate having a certain level of a concave and convex shape by forming a proper concave and convex shape or mesh configuration at a stage of the transferring member.

Further, according to the manufacturing apparatus of a semiconductor device, one of the present invention, since concaves and convexes of the semiconductor substrate to be subjected to treatment are formed based on a concave and convex shape or a mesh configuration which the transferring member has, a semiconductor device, which includes the semiconductor substrate having concaves and convexes reflecting the concave and convex shape or the mesh configuration of the transferring member, so to speak, as a die or a mold, can be manufactured. That is, it is possible to manufacture stably a semiconductor device including not a semiconductor substrate having highly random, in other words, poorly-reproducible concaves and convexes like conventional concaves and convexes, but a semiconductor substrate having a certain level of a concave and convex shape by forming a proper concave and convex shape or mesh configuration at a stage of the transferring member.

Further, according to the transferring member, one of the present invention, since concaves and convexes of the semiconductor substrate to be subjected to treatment are formed based on a concave and convex shape or a mesh structure which the transferring member has, it is possible to supply stably the semiconductor substrate having concaves and convexes reflecting the concave and convex shape or the mesh structure of the transferring member, so to speak, as a die or a mold.

BRIEF DESCRIPTION OF THE DRAWINGS

FIG. 2G is a schematic sectional view illustrating a substrate to be treated after the step of transfer in First Embodiment of the present invention.

FIG. 3 is a SEM photograph of a surface of a substrate to be treated in First Embodiment of the present invention.

FIG. 4 is a schematic sectional view illustrating a substrate to be treated after the step of transfer in Variation Example (1) of First Embodiment of the present invention.

FIG. 5 is a SEM photograph of a surface of a substrate to be treated in Second Embodiment of the present invention.

Figure 1:
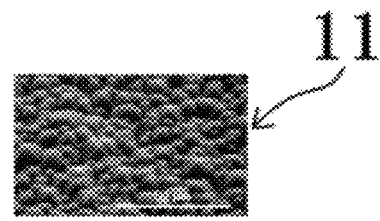
FIG. 1 is a SEM (scanning electron microscope) photograph of a partial surface of a transferring member during a manufacturing process in First Embodiment of the present invention.

DESCRIPTION OF REFERENCE SIGNS 10, 10a Transferring member
10b Mesh-like transferring member
11 n-type silicon substrate subjected to treatment by a mixed solution
12, 22, 22a Surface convexed or concaved or surface concaved or convexed
13 Oxide film
15 Silicon nitride film
17 Catalyst material
19 Process liquid
20, 20a Substrate to be treated
40 Treatment bath
42 Holder
30 Polycrystalline substrate
31 i-type a-Si layer
32 p+ type a-Si layer
34 Surface electrode layer
36 Backside electrode layer
50, 51, 52 Manufacturing apparatus of a semiconductor device
55, 56 Supply unit
57a, 57b, 57c, 57d Roll body
59 Locating unit
100 Semiconductor device (solar cell)

EMBODIMENTS OF THE INVENTION

Next, an embodiment of the present invention will be described in detail based on the attached drawings. In addition, in this description, parts are given as reference characters throughout all drawings unless otherwise specified. In addition, in drawings, elements in the present embodiment are not necessarily drawn with the same scales.

First Embodiment

Figure 2A:
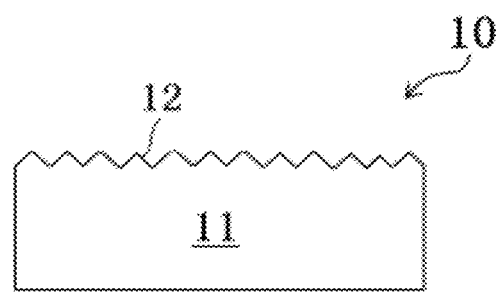
FIG. 2A is a schematic sectional view showing one process of a method of manufacturing a transferring member in First Embodiment of the present invention.

In the present embodiment, at first, a method of manufacturing a transferring member 10 for forming the surface of a semiconductor substrate (substrate to be subjected to a treatment, hereinafter, also referred to as a "substrate to be treated") to be used for a semiconductor device (a solar cell in the present embodiment) into a concave and convex shape will be described. FIG. 1 is a scanning electron microscope (hereinafter, referred to as SEM) photograph of a partial surface of a transferring member during a manufacturing process in the present embodiment. FIG. 2A to FIG. 2D are a schematic sectional view showing one process of a method of manufacturing a transferring member 10 in the present embodiment. Further, FIG. 2F is a schematic sectional view illustrating the step of transfer to a substrate to be treated in the present embodiment. Further, FIG. 2G is a schematic sectional view illustrating a substrate to be treated after the step of transfer in the present embodiment.

In manufacturing of the transferring member 10, at first, a monocrystalline n-type silicon (100) substrate (resistivity: 1 to 20 Ωcm) subjected to surface washing treatment by the so-called RCA washing method is immersed in a mixed aqueous solution of sodium hydroxide (NaOH) having a molar concentration of 0.25 mol/dm$^3$ and 2-propanol having a molar concentration of 0.6 mol/dm$^3$ for 20 minutes. FIG. 1 is a SEM photograph of the surface of the n-type silicon substrate 11 subjected to the above-mentioned treatment, and FIG. 2A is a sectional structural view schematically showing the surface shown in FIG. 1. As shown in FIG. 1, a surface 12 with highly uniform pyramid-like convexes and concaves, that is, a surface having a texture structure can be formed. According to the present inventor's experiments, by performing the so-called anisotropic alkali-etching in which a monocrystalline silicon (Si-(100)) is immersed in an aqueous solution of sodium hydroxide (NaOH) having a molar concentration of about 0.01 mol/dm$^3$ to 5 mol/dm$^3$ containing 2-propanol for 10 to 30 minutes, the reflectance of incident light (light with a wavelength of infrared wavelength or less) at the surface of a substrate can be significantly reduced compared with a merely flat substance or a planar substance.

Figure 2B:
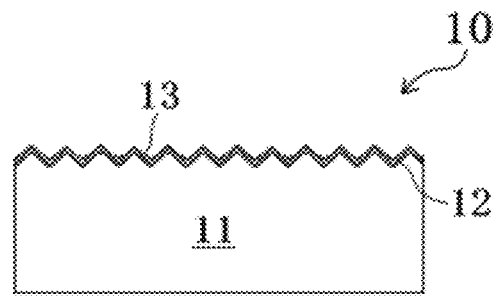
FIG. 2B is a schematic sectional view showing one process of a method of manufacturing a transferring member in First Embodiment of the present invention.

Next, as shown in FIG. 2B, a thin oxide film (SiO$_2$) 13 was formed on the surface of the n-type silicon substrate 1. The oxide film 13 of the present embodiment was formed by using a wet oxidation method. The thickness of the oxide film 13 was several nanometers (nm) to several hundreds nanometers (nm). The oxide film 13 functions as a peel-preventive layer in order to enhance the adhesion of the catalyst material described later to the surface of the n-type silicon substrate 11. Any of a usual thermal oxidation method, a CVD deposition method, and a chemical production method of an oxide film can be applied to the formation of the oxide film 13 in addition to the above-mentioned wet oxidation method. Further, even when the thickness of the oxide film 13 is 1 μm or less, a highly stable thin film is formed.

Figure 2C:
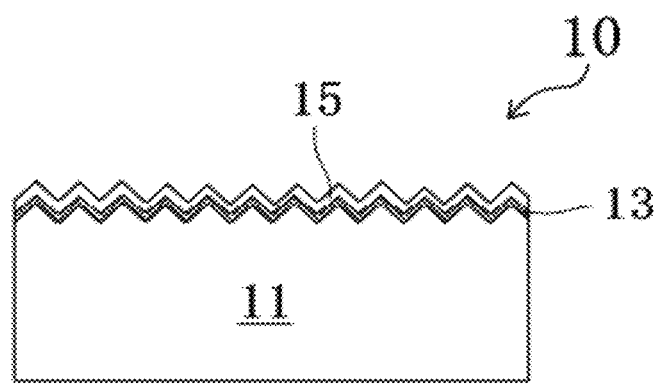
FIG. 2C is a schematic sectional view showing one process of a method of manufacturing a transferring member in First Embodiment of the present invention.

In the present embodiment, as shown in FIG. 2C, a silicon nitride ($Si_3N_4$) film 15, an interlayer film, was further formed on the oxide film 13. Herein, the silicon nitride film 15 of the present embodiment was formed by using a deposition method referred to as a cat-CVD method. With respect to specific conditions, the pressure was 1 Pa. The flow rate of nitrogen ($N_2$) was 0.6 sccm and the flow rate of argon (Ar) was 0.4 sccm. The silicon nitride film 15 having a thickness of about 1 μm was formed by setting a film-forming time at 2 hours under the conditions described above. In addition, as a manufacturing method of the silicon nitride film 15, a low pressure CVD method and a sputtering method can be applied in addition to the above-mentioned cat-CVD method. When the low pressure CVD method is employed, since the adhesion between the silicon nitride film and the n-type silicon substrate 11 is high, the above oxide film 13 becomes unnecessary.

By the way, the silicon nitride film 15 is used as the so-called intermediate layer which functions as a protective film of the n-type silicon substrate 11 in the transferring member 10, or as an impermeable layer against a process liquid described later. Therefore, the silicon nitride film 15 can also function as the peel-preventive layer of a catalyst material 17 described later. In the present embodiment, as described above, laminating two layers of the oxide film 13 and the silicon nitride film 15 largely contributes to the stability and reliability of the transferring member 10 since the catalyst material 17 is prevented from peeling off and resistance to the process liquid described later is improved.

Figure 2D:
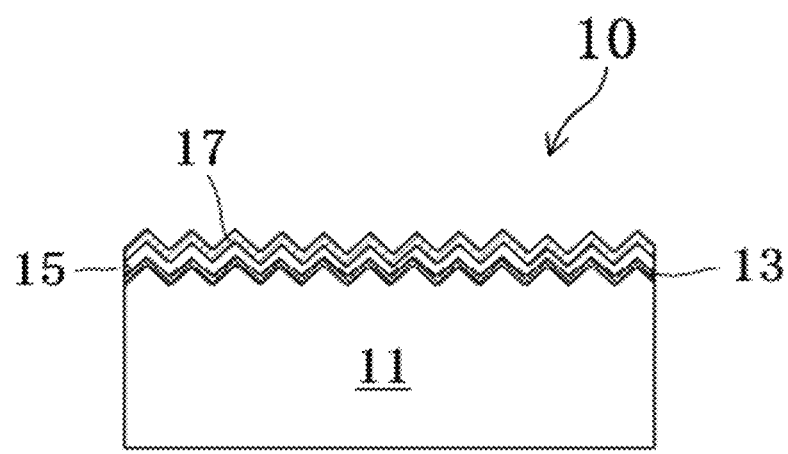
FIG. 2D is a schematic sectional view showing one process of a method of manufacturing a transferring member in First Embodiment of the present invention.

Next, as shown in FIG. 2D, in the present embodiment, a platinum (Pt) film serving as a catalyst material 17 was formed on the silicon nitride film 15 by using an electron beam (EB) deposition method. The thickness of the platinum film of the present embodiment was about 50 to 100 nm. In this time, the adhesion of the platinum film was increased by heating the n-type silicon substrate 11 to 350° C. It is also a preferred aspect to subject the n-type silicon substrate 11 to heating treatment of several hundreds degrees in an inert gas after forming a film in order to further increase the adhesion of the platinum film to the n-type silicon substrate 11. Herein, in the present embodiment, a platinum (Pt) film was formed by using an electron beam (EB) deposition method, but a vacuum deposition method and a sputtering method may be employed in place of the electron beam (EB) deposition method.

Figure 2E:
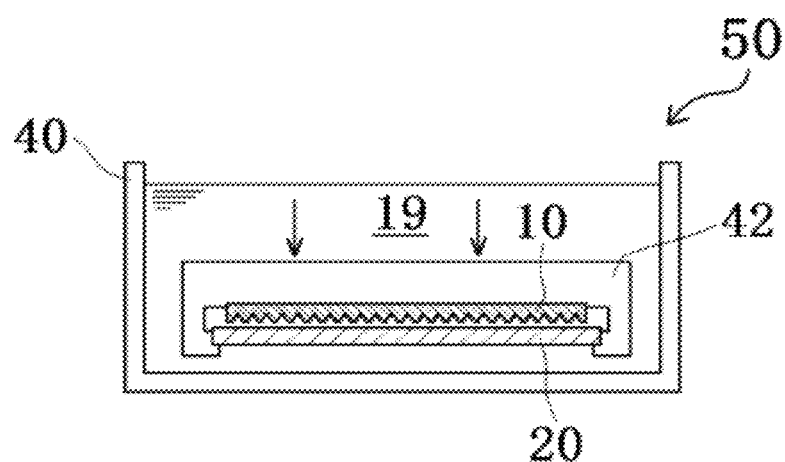
FIG. 2E is a schematic view showing a configuration of a principal part of a manufacturing apparatus of a semiconductor device in First Embodiment to Fourth Embodiment of the present invention.
Figure 2F:
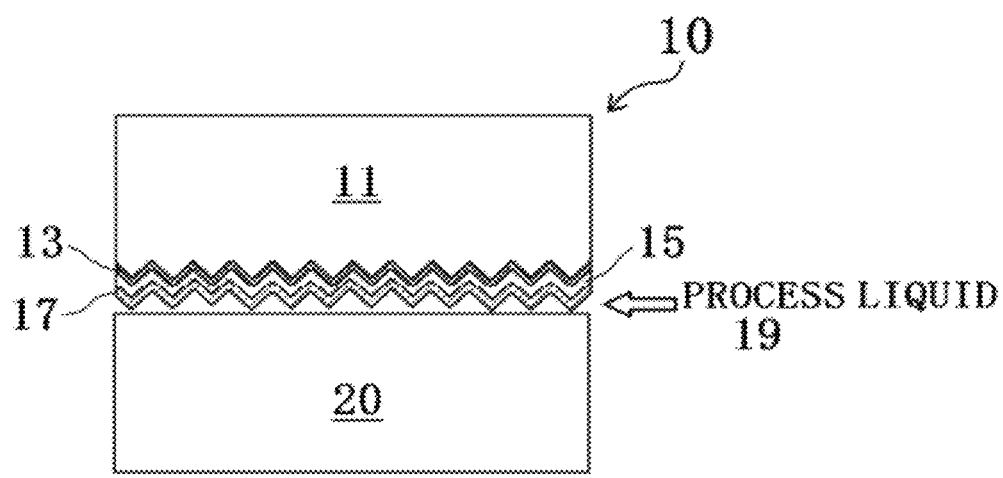
FIG. 2F is a schematic sectional view illustrating the step of transfer to a substrate to be treated in First Embodiment of the present invention.

Subsequently, the n-type silicon substrate 11, in which a film of the catalyst material 17 is formed on the above-mentioned surface 12 with pyramid-like convexes and concaves, is used as a transferring member 10, and a concave and convex shape of a semiconductor substrate to be subjected to treatment was formed. FIG. 2E is a schematic view showing a configuration of a principal part of a manufacturing apparatus 50 of a semiconductor device in the present embodiment. A substrate 20 to be treated of the present embodiment is a monocrystalline silicon (100) substrate which is a semiconductor substrate.

In the present embodiment, a locating unit, which opposes the above surface 12 with pyramid-like convexes and concaves to the substrate 20 to be treated, and locates the transferring member 10 including a catalyst material 17 at a position in contact with or close to the substrate 20 to be treated, is disposed. The top of a convex of the platinum film surface of the catalyst material 17 has been subjected to surface washing treatment by the RCA washing method in order to avoid the contamination of the surface of the substrate 20.

Thereafter, a mixed aqueous solution of hydrofluoric acid (HF) as a dissolving agent and a hydrogen peroxide solution ($H_2O_2$) as an oxidizing agent is supplied as a process liquid 19 between the surface of the substrate 20 to be treated and the platinum film of the catalyst material 17 (FIG. 2F). In the present embodiment, as shown in FIG. 2E, the locating unit immersed the transferring member 10 and the substrate 20 to be treated, which is opposed to the transferring member 10, in a process liquid 19 in a treatment tank 40 serving as a supply unit of the process liquid by use of a holder 42 to perform the above-mentioned treatment. In addition, more specifically, the process liquid 19 is a mixed aqueous solution of 5.3 M of hydrofluoric acid (HF) and 1.8 M of a hydrogen peroxide solution ($H_2O_2$) (5.3 mol of HF and 1.8 mol of $H_2O_2$ are contained in 1 $dm^3$ of water).

The substrate 20 to be treated was maintained at 25° C. for 2 hours under the above-mentioned condition, and then the surface of the substrate 20 to be treated was observed. Consequently, as shown in FIG. 2G, a surface 22 concaved or convexed at the surface of the substrate 20 to be treated was recognized. FIG. 3 is a SEM photograph of the surface of the substrate 20 to be treated obtained in the present embodiment. Interestingly, when FIG. 1 is compared with FIG. 3, it is found that a surface convexed or concaved of the transferring member 10 in FIG. 1 is converted to a surface concaved or convexed in which a convex is inverted to a concave in FIG. 3, and is transferred as an inverted pyramid structure having almost the same shape. The reason for this is probably that etching of the substrate 20 to be treated starts from the top of a convex portion at the surface of the transferring member 10 which is an insoluble matrix having a surface 12 convexed or concaved, and proceeds successively toward an inclined surface along the convex shape. Accordingly, it is preferred to press the transferring member 10 against the surface of the substrate 20 to be treated as required so that a platinum surface as the catalyst material 17 on the surface of a transferring member 10 is in contact with the substrate 20 to be treated, or is close to the surface as far as possible. However, it is necessary to avoid a state in which the surface 12 convexed or concaved at the surface of the transferring member 10 is brought into close contact with the surface (the so-called transfer target surface) of the substrate 20 to be treated to reject the process liquid 19 between both surfaces, and therefore etching of the substrate 20 to be treated does not occur. Therefore, in pressing the transferring member 10, empirically moderate conditions of contacting or being close may be established in order to keep a moderate constant supply of the process liquid 19. In addition, in the present embodiment, the immersion time in the process liquid 19 was 2 hours, but the present inventor verified that even when the immersion time is from several minutes to 30 minutes, an equal surface shape can be formed.

Variation Example (1) of First Embodiment

By the way, in the present embodiment, an oxide film ($SiO_2$) 13 and a silicon nitride ($Si_3N_4$) film 15 are formed on the surface of an n-type silicon substrate 11, but First Embodiment is not limited to this laminated structure.

For example, FIG. 4 is a schematic sectional view illustrating a substrate 20a to be treated after the step of transfer in the present embodiment. As shown in FIG. 4, a transferring member 10a of the present embodiment is not provided with an oxide film 13 as distinct from the transferring member 10 of First Embodiment. Therefore, a silicon nitride ($Si_3N_4$) film 15 is formed on the surface of the n-type silicon substrate 11 by the same means as in the film forming method of First Embodiment.

Even when such a transferring member 10a is used, at least a part of the effects of First Embodiments can be exerted. That is, the surface of the substrate 20a to be treated substantially reflects the configuration of the surface of the transferring member 10a, in other words, the configuration of the surface of the transferring member 10a is transferred to the surface of the substrate 20a to be treated, and consequently the surface 22a concaved or convexed of the substrate is formed.

Variation Example (2) of First Embodiment

In addition to Variation Example (1) of First Embodiment, for example, even a laminate in which only an oxide film ($SiO_2$) 13 is formed on the surface of the n-type silicon substrate 11, or even a transferring member in which a catalyst material 17 is directly placed on the surface of the n-type silicon substrate 11 can achieve at least a part of the effect of First Embodiment. However, from the viewpoint of preventing the catalyst material 17 from peeling off from the n-type silicon substrate 11 and from the viewpoint of protecting the n-type silicon substrate 11 itself from dissolution, other two aspects other than the transferring member in which the catalyst material 17 is directly placed on the surface of the n-type silicon substrate 11 are more preferred, and it is most preferred to employ a structure in which the oxide film ($SiO_2$) 13 and the silicon nitride ($Si_3N_4$) film 15 are formed as with First Embodiment.

Second Embodiment

A surface concaved or convexed of a substrate to be treated in the present embodiment is formed by the same manufacturing method of a transferring member 10 and a substrate 20 to be treated as in First Embodiment except that the substrate 20 to be treated in First Embodiment is a monocrystalline silicon (111) substrate. Therefore, a description duplicating that in First Embodiment can be omitted.

FIG. 5 is a SEM photograph of a surface of a substrate to be treated in the present embodiment. It is found that as shown in FIG. 5, although there are a few differences in the respective concaves and convexes such as the depth from the surface of the substrate 20 to be treated, a surface of the substrate 20a to be treated substantially reflecting the surface concaved or convexed of the transferring member 10, in other words, a texture structure to which the surface concaved or convexed of the transferring member 10 is transferred, that is, a surface with a so-called inverted pyramid-like concave and convex structure in which a concave is the reverse of a convex is formed. Accordingly, it was verified that the configuration of the surface of the transferring member 10 is transferred to the surface without depending on the crystal orientation of a monocrystalline silicon substrate.

Third Embodiment

A surface concaved or convexed of a substrate to be treated in the present embodiment is formed by the same manufacturing method of a transferring member 10 and a substrate 20 to be treated as in First Embodiment except that the substrate 20 to be treated is a polycrystalline silicon (poly-Si) substrate and the treatment time by a process liquid 19 in First Embodiment is different. Therefore, a description duplicating that in First Embodiment can be omitted.

Figure 6:
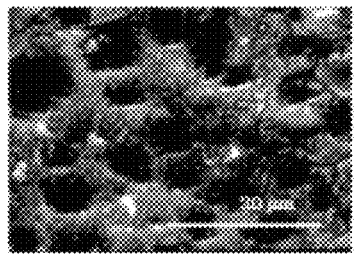
FIG. 6 is a SEM photograph of a surface of a substrate to be treated in Third Embodiment of the present invention.

In the present embodiment, a polycrystalline silicon (Poly-Si) substrate, a substrate 20 to be treated, was immersed in the process liquid 19 for 4 hours. FIG. 6 is a SEM photograph of a surface of a substrate 20 to be treated in the present embodiment. As shown in FIG. 6, although there are a few differences in the respective concaves and convexes, which are thought to depend on smoothness of the substrate 20 to be treated, a surface having a texture structure (inverted pyramid-like) which is a transfer structure substantially resembling the concave and convex structure of the transferring member 10 is formed. Herein, the time of formation of concaves and convexes formed on the surface of the substrate 20 to be treated can be significantly reduced by controlling the concentrations of hydrofluoric acid and a hydrogen peroxide solution in the process liquid 19. Specifically, for example, by controlling the concentration of hydrogen peroxide, the time of treatment by the process liquid 19 can be significantly reduced.

Figure 7:
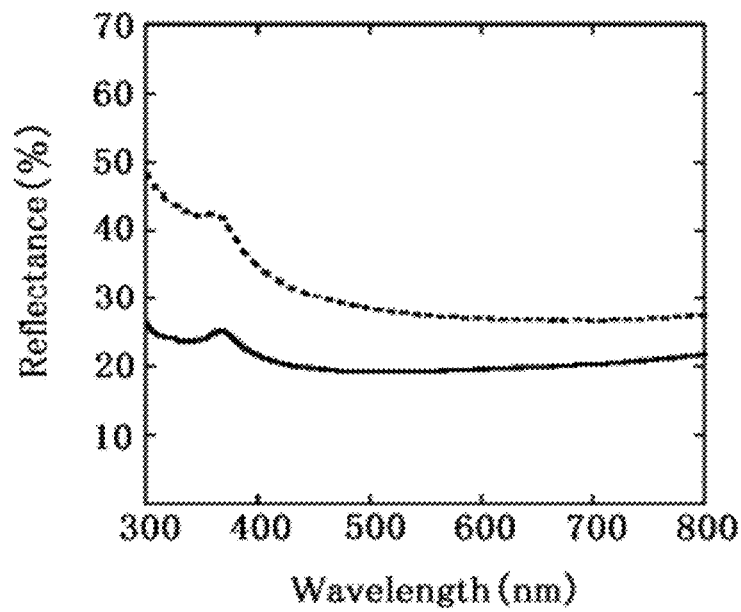
FIG. 7 is a spectral reflectance characteristic of a surface of a substrate to be treated in Third Embodiment of the present invention.

Further, FIG. 7 is a view of a spectral reflectance characteristic of a surface of a polycrystalline silicon substrate in the present embodiment. A solid line in FIG. 7 represents the result of the surface of the substrate 20 to be treated measured after treatment in the present embodiment, and a dotted line represents the result of the surface of the substrate 20 to be treated measured before the treatment. As is evident from FIG. 7, it is verified that the reflectance of the surface of the substrate 20 to be treated after treatment in accordance with the present embodiment is significantly reduced in all wavelengths from 300 nm to 800 nm in comparison with the untreated surface.

Fourth Embodiment

Figure 8:
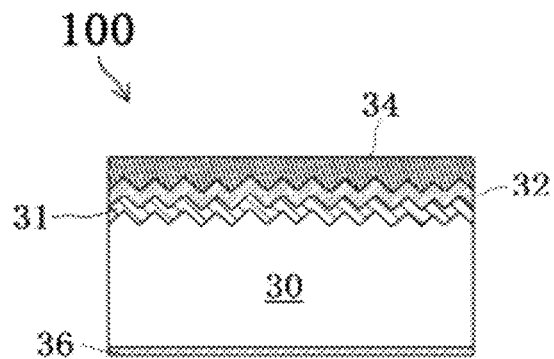
FIG. 8 is a schematic sectional view of a principal part of a solar cell in Fourth Embodiment of the present invention.

FIG. 8 is a schematic sectional view of a principal part of a solar cell 100 manufactured by using a polycrystalline silicon substrate of the present embodiment.

In the present embodiment, an i-type a-Si layer 31 and a $p^+$-type a-Si layer 32 are laminated and formed on the n-type polycrystalline silicon substrate 30 having a surface concaved or convexed formed by Third Embodiment described above by using a publicly known film forming technology (e.g., plasma chemical vapor deposition (PCVD) method). Thereafter, in the present embodiment, an ITO film, a transparent conductive film, is formed on the $p^+$-type a-Si layer 32 as surface electrode layers 34, for example, by a publicly known sputtering method. Further, an $n^+$-type a-Si layer of a backside electrode layer 36 is formed on the opposite side of the polycrystalline silicon substrate 30 by a publicly known film forming technology (e.g., plasma chemical vapor deposition (PCVD) method).

As shown in FIG. 8, by manufacturing a solar cell 100 using the polycrystalline silicon substrate 30 having the surface formed by performing the treatment in Third Embodiment described above, the reduction of the reflectance of light and the improvement in a photocurrent are realized by virtue of the effect of preventing reflection of incident light within the solar cell 100.

Explaining with reference to FIG. 2E and FIG. 2F, in any of Embodiments described above, a mechanism of a reaction by the process liquid 19 is thought to be as follows. First, a platinum film as a catalyst material 17 on a transferring member 10 or above the transferring member 10 acts as a decomposition catalyst of the oxidizing agent at the surface of the substrate 20 to be treated in the process liquid 19 containing hydrofluoric acid (aqueous HF solution) and a hydrogen peroxide solution (aqueous $H_2O_2$ solution) as an oxidizing agent.

Consequently, an atomic oxygen produced from the oxidizing agent oxidizes a silicon substrate of the substrate 20 to be treated. Then, a process in which the oxidized site is dissolved by hydrofluoric acid in the process liquid 19 is generated. Thereby, oxidation of the surface of the substrate 20 to be treated and dissolution of the oxidized site in the process liquid 19 are promoted, and consequently, the configuration of the surface of the transferring member is probably approximately reflected by the surface of the substrate 20 to be treated, in other words, the configuration of the surface of the transferring member is probably transferred to the surface of the substrate 20 to be treated.

Other Variation Examples of First Embodiment to Fourth Embodiment

By the way, in Embodiments described above, as typically shown in FIG. 2F, the transferring member 10 is located at a position in contact with or close to the substrate 20 to be treated, and then the process liquid 19 is supplied between the surface of the substrate 20 to be treated and the catalyst material 17, but Embodiments described above are not limited to this aspect.

For example, the case where after the process liquid 19 is supplied onto the surface of the substrate 20 to be treated, it can be employed to locate the transferring member 10 at a position in contact with or close to the substrate 20 to be treated. When this procedure is employed, since the difficulty of spreading the process liquid 19 uniformly through a gap between the surface of the substrate 20 to be treated and the catalyst material 17 is resolved, this is a preferred aspect.

In addition, in the above-mentioned embodiments, as shown in FIG. 2E, each treatment was performed by a manufacturing apparatus 50 of a semiconductor device including a supply unit 55 for supplying a process liquid 19 that oxidizes and dissolves a substrate 20 to be treated onto the surface of the substrate 20 to be treated, and a locating unit 56 for locating a transferring member at a position in contact with or close to the surface of the substrate 20 to be treated. In addition, both of the supply unit 55 and the locating unit 56 include a control section which performs the control of each treatment, for example, monitors the concentration of the process liquid 19, or comprehensively controls.

Fifth Embodiment

Figure 9:
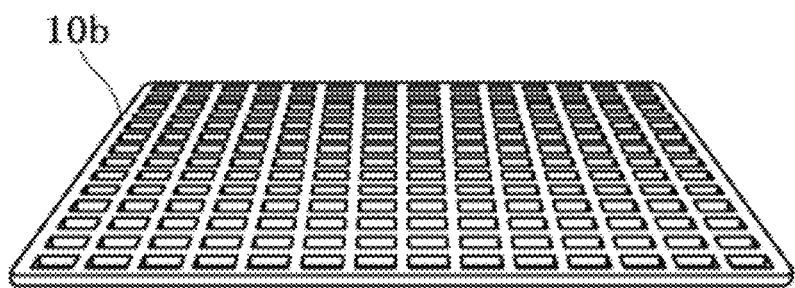
FIG. 9 is an external perspective view of a mesh-like transferring member in Fifth Embodiment of the present invention.

A surface concaved or convexed of a substrate to be treated in the present embodiment is formed by the same manufacturing method as in First Embodiment except that mainly, a mesh-like transferring member shown in FIG. 9 (hereinafter, referred to as a mesh-like transferring member) 10b was used in place of the transferring member 10 of First Embodiment. Therefore, a description duplicating that in First Embodiment can be omitted.

The mesh-like transferring member 10b in the present embodiment is prepared by plating "α Mesh" (number of meshes: 400) manufactured by Mesh Corporation with nickel (Ni) of 4 μm in thickness, palladium (Pd) of 1 μm in thickness, and platinum (Pt) of 4 μm in thickness in this order by multistep plating.

In the present embodiment, the mesh-like transferring member 10b was placed on the substrate 20 to be treated while the substrate 20 to be treated which had been subjected to RCA washing was immersed in the process liquid 19, and this was treated for 30 minutes. Thereafter, the substrate 20 to be treated was rinsed for 3 minutes with ultra pure water.

Figure 10:
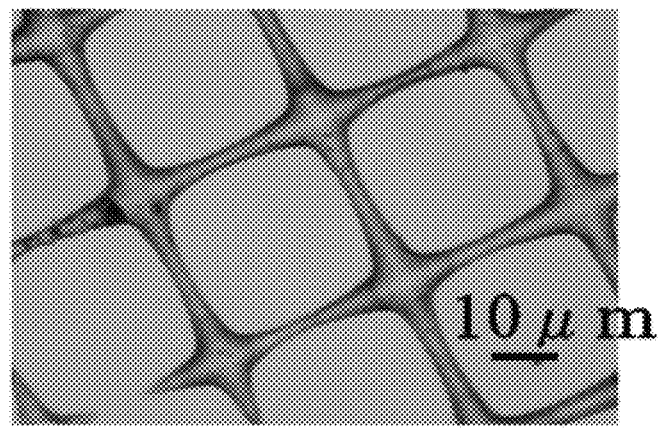
FIG. 10 is an optical micrograph (plane photograph) of a surface of a substrate to be treated in Fifth Embodiment of the present invention.

As a result of this, a substrate 20 to be treated, on which concaves and convexes reflecting a shape of the mesh-like transferring member 10b are formed, was obtained. FIG. 10 is an optical micrograph (plane photograph) of a surface of a substrate 20 to be treated in the present embodiment. Further, FIG. 11A is a plane photograph of an object part to be measured by a laser interference microscope, and FIG. 11B is a view representing the cross-sectional profile of the object part to be measured in FIG. 11A, taken on line X-X.

Figure 11A:
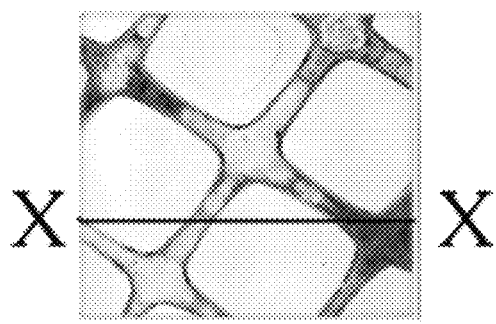
FIG. 11A is a plane photograph of an object part to be measured by a laser interference microscope in Fifth Embodiment of the present invention.
Figure 11B:
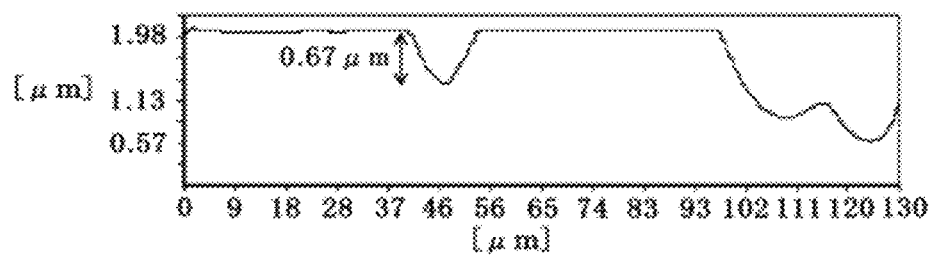
FIG. 11B is a sectional view representing the cross-sectional profile of the object part to be measured in FIG. 11A, taken on line X-X.

As shown in FIGS. 10, 11A and 11B, although there are a few differences in the respective concaves and convexes, a surface having a structure in which concave portions are formed substantially corresponding to a mesh portion of the mesh-like transferring member 10b is formed. Therefore, also in the present embodiment in which the transferring member including a fine mesh-like structure facilitating supply of the process liquid 19 is employed, it was verified that the same effects as in the Embodiments described above can be achieved.

Sixth Embodiment

A surface concaved or convexed of a substrate to be treated in the present embodiment is formed by the same manufacturing method as in First Embodiment except that mainly, a mesh-like transferring member 10b was used in place of the transferring member 10 of First Embodiment and the manufacturing apparatus 50 of a semiconductor device of First Embodiment was changed to a manufacturing apparatus 51 of a semiconductor device. Therefore, a description duplicating those in First Embodiment and Fifth Embodiment can be omitted. In addition, the mesh-like transferring member 10b of the present embodiment is prepared by plating a SUS304 material as a base material, which is much cheaper than "α Mesh" (number of meshes: 400) manufactured by Mesh Corporation with palladium (Pd) alloy containing nickel (Ni) in an amount of 15% of 0.5 to 1 lam in thickness, and platinum (Pt) of about 1 μm in thickness in this order by multistep plating.

Figure 12:
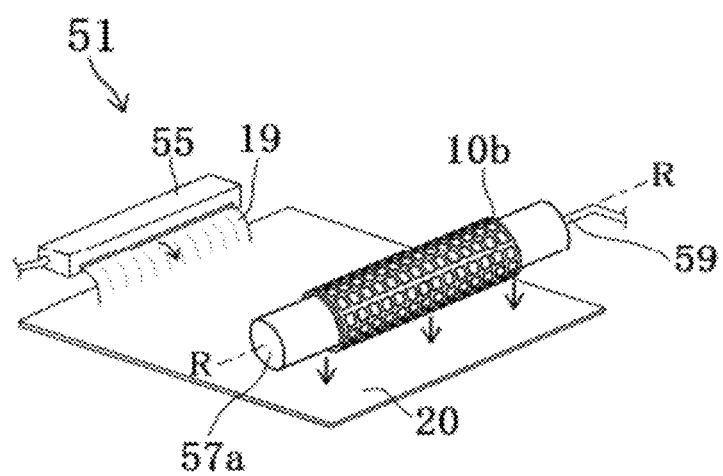
FIG. 12 is a schematic view showing a configuration of a principal part of a manufacturing apparatus of a semiconductor device in Sixth Embodiment of the present invention.
Figure 13:
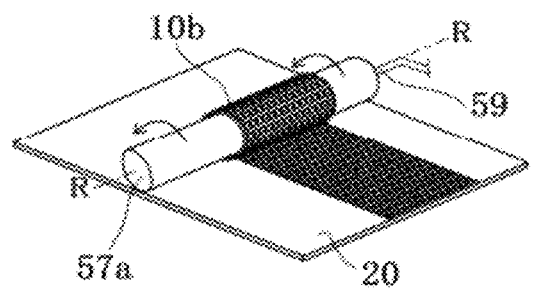
FIG. 13 is a view illustrating a state after placing a roll body on the substrate to be treated (during treating the substrate to be treated) in Sixth Embodiment of the present invention.

FIG. 12 is a schematic view showing a configuration of a principal part of a manufacturing apparatus 51 of a semiconductor device in the present embodiment. In addition, FIG. 12 indicates a state before placing a roll body 57a on the substrate 20 to be treated in the present embodiment. FIG. 13 is a view illustrating a state after placing the roll body 57a on the substrate 20 to be treated (during treating the substrate to be treated) in the present embodiment. Further, the substrate 20 to be treated of the present embodiment is a monocrystalline silicon (100) substrate which is a semiconductor substrate.

As shown in FIG. 12, broadly speaking, the manufacturing apparatus 51 of a semiconductor device of the present embodiment includes a supply unit 55 which supplies a process liquid 19 onto the surface of the substrate 20 to be treated and a locating unit 59 which locates a mesh-like transferring member 10b including a catalyst material (a Pt (platinum) layer in the present embodiment) at a position in contact with or close to the surface of the substrate 20 to be treated. More specifically describing the locating unit 59, in the present embodiment, the mesh-like transferring member 10b is bonded to the surface of a roll body 57a in which a shape in a cross-section perpendicular to its rotation axis (line R-R in FIG. 12) is circular, and thereby the mesh-like transferring member 10b is disposed along the surface of the roll body. The locating unit 59 first moves the roll body 57a so that at least a part of the mesh-like transferring member 10b is located at a position in contact with or close to the surface of the substrate 20 to be treated in a state in which the process liquid 19 is supplied onto the surface of the substrate 20 to be treated. The locating unit 59 includes a control part by which after the above-mentioned operation, the roll body 57a is moved and rotated relative to the substrate 20 to be treated while maintaining the state of having located the mesh-like transferring member 10b, as shown in FIG. 13. In other words, the locating unit 59 first moves the roll body 57a so that the surface of the roll body 57a is opposed to a plane of the substrate 20 to be treated as shown in FIG. 12, and then moves and rotates the roll body 57a relative to the surface of the substrate 20 to be treated as shown in FIG. 13.

Therefore, in the present embodiment, after the process liquid 19 of 60° C. is supplied onto the surface of the substrate 20 to be treated, different parts of the mesh-like transferring member 10b come to be opposed to a plane of the substrate 20 to be treated one after another through the rotation and movement of the roll body 57a. In addition, in the process liquid 19 of the present embodiment, the concentration of an aqueous hydrofluoric acid solution (HF) is 2.7 M and the concentration of a hydrogen peroxide solution ($H_2O_2$) is 8.1 M. Accordingly, particularly when the concentration of a hydrogen peroxide solution ($H_2O_2$) is 1 M or more and 10 M or less like the present embodiment, it is preferred to employ, as a catalyst material, at least one selected from the group consisting of platinum (Pt), palladium (Pd), rhodium (Rh), gold (Au) and silver (Ag), which are noble metals less prone to being oxidized by the process liquid 19 of the present embodiment, and alloys of at least two thereof.

Further, the material of the roll body 57a in the present embodiment was nickel (Ni) and the diameter of the roll body 57a was 35 mm. The rotational speed of the roll body 57a was about 0.27 rev/sec and its movement speed was about 30 mm/sec. Accordingly, for example, when a monocrystalline silicon wafer having a diameter of 6 inches is used as the substrate 20 to be treated, a treatment in the present embodiment can be finished in about 5 seconds. In addition, an apparatus structure for manufacturing a semiconductor device and a control method of the aspect, in which the roll body 57a only rotates without moving and the substrate 20 to be treated moves as distinct from the aspect in which the roll body 57a moves and thereby the entire substrate 20 to be treated is treated like the present embodiment, can be employed. Moreover, publicly known treatment aspects, including an aspect of batch processing in which a plurality of substrates 20 to be treated having a size of 6 inches are continuously processed to improve a processing speed, can be appropriately employed.

Figure 14A:
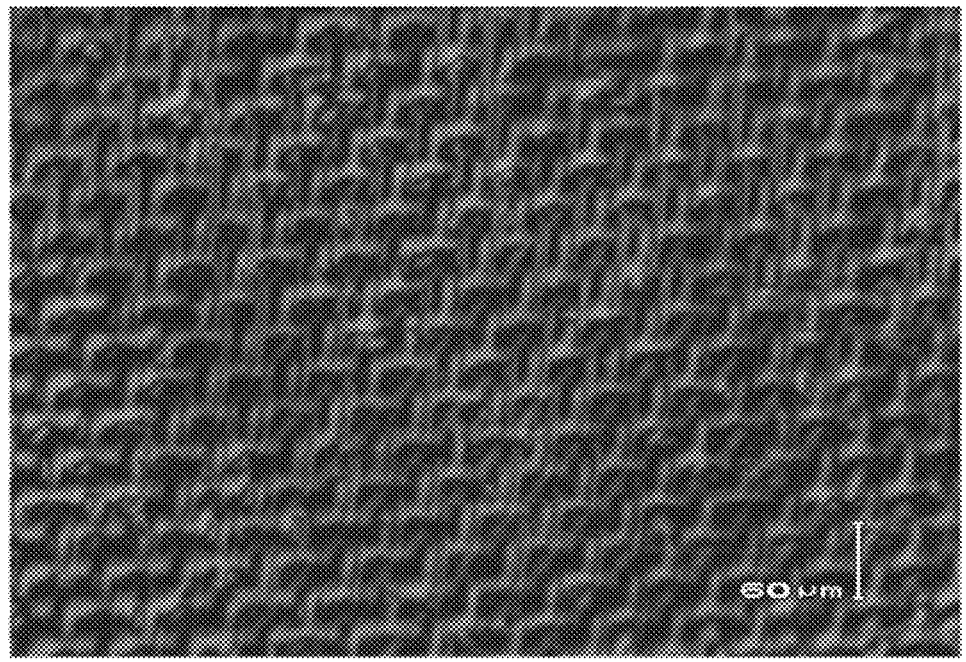
FIG. 14A is an optical micrograph (plane photograph) of a surface of a substrate to be treated, which has been treated at 60° C., in Sixth Embodiment of the present invention.
Figure 14B:
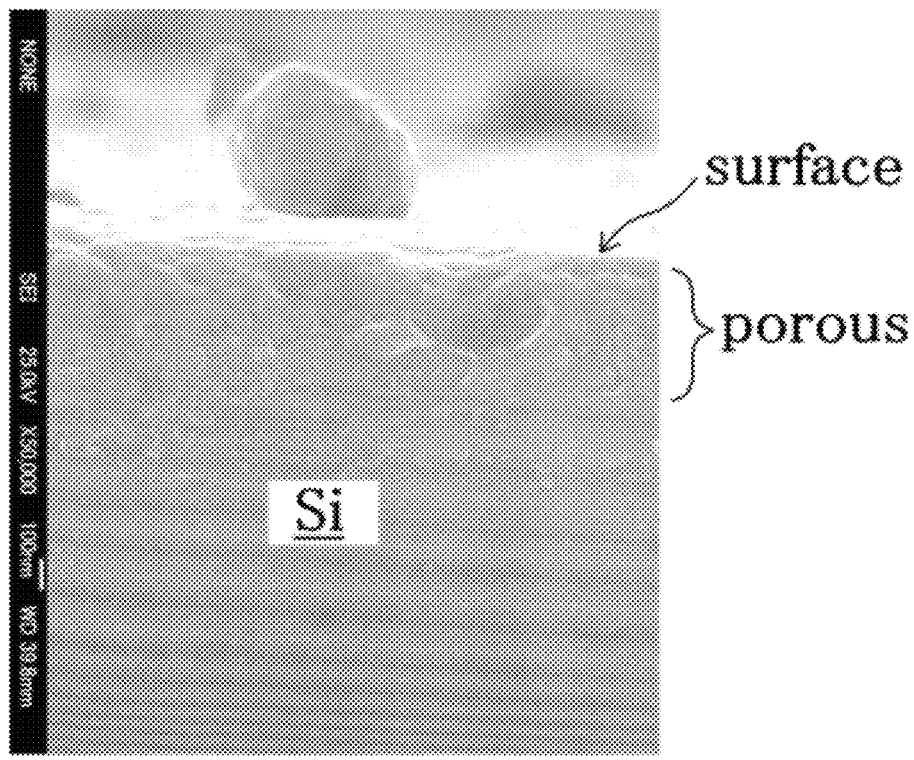
FIG. 14B is an optical micrograph of a cross-section around the surface of the substrate to be treated, which has been treated at 60° C., in Sixth Embodiment of the present invention.

As a result of the above treatment, as schematically shown in FIG. 13, a substrate 20 to be treated having a surface concaved or convexed was formed in the track of the roll body 57a. FIG. 14A is an optical micrograph (plane photograph) of a surface of a substrate 20 to be treated in the present embodiment. Further interestingly, the present inventor observed and analyzed the surface of the substrate 20 to be treated in detail, and consequently, found that an infinite number of discontinuous pores were formed aside from the concaves and convexes formed by the mesh-like transferring member 10b, in other words, in the vicinity of a mesh different from a position of a mesh in the mesh-like transferring member 10b, more specifically, in the vicinity of a concave portion in a convex portion where the aforementioned concave portion was not formed by the mesh on the surface of the substrate 20 to be treated. In addition, in the case of the present embodiment, most of the convex portion became porous because the space between meshes was small. FIG. 14B is an optical micrograph of a cross-section around the surface of the substrate 20 to be treated in the present embodiment. As shown in FIG. 14B, it became evident that the thickness of a porous layer was as small as about 500 nm. That is, a substrate 20 to be treated, having a porous surface, was formed by the manufacturing apparatus 51 of a semiconductor device of the present embodiment.

Figure 15:
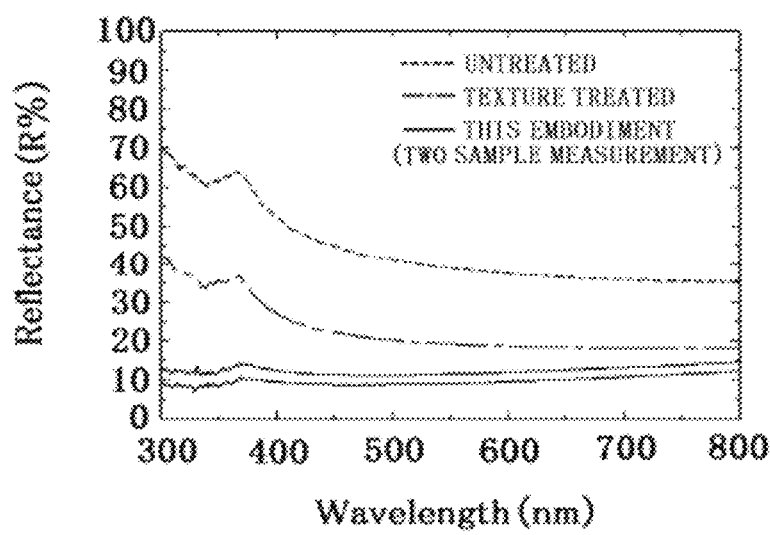
FIG. 15 is a graph describing the reflectance of the surface of the substrate to be treated, which has been treated at 60° C., in Sixth Embodiment of the present invention.

Then, the reflectance of the surface of the substrate 20 to be treated in the present embodiment was investigated, and consequently a very interesting result was obtained. FIG. 15 is a graph describing the reflectance of the surface of the substrate 20 to be treated, which has been treated at 60° C., in the present embodiment. In addition, for comparison, an untreated substrate 20 to be treated and a substrate 20 to be treated provided with a surface of the texture structure employed in the transferring member 10 (corresponding to the surface 12 convexed or concaved in FIG. 1) were prepared. In FIG. 15, a dotted line represents the results of the untreated substrate 20 to be treated, a dashed line (denoted by "texture treated" in FIG. 15) represents the results of the above-mentioned substrate 20 to be treated provided with a surface of the texture structure, and a solid line represents the results of the substrate 20 to be treated of the present embodiment. Moreover, measurement of the substrate 20 to be treated of the present embodiment was performed by using two samples in order to check repeatability.

As shown in FIG. 15, with respect to the light reflectance of the surface of the substrate 20 to be treated in the present embodiment, it was verified that the reflectance of light in at least the wavelength range of 300 nm or more and 800 nm or less, which is a measurable range of a reflectance measuring and processing apparatus (manufactured by JASCO Corporation, ultraviolet-visible (UV-Vis)/near-infrared (NIR) spectrophotometer, model V-570), was significantly lower than any of comparative examples. Particularly, the reflectance of light on a short wavelength side was significantly reduced. The reason for this is probably that a substrate 20 to be treated, which includes a surface having an infinite number of discontinuous fine pores, was formed by the treatment of the present embodiment. Accordingly, it became evident that by the manufacturing apparatus 51 of a semiconductor device of the present embodiment and a manufacturing method thereof, it is possible to obtain a substrate 20 to be treated in which the reflectance of light having a wavelength of 300 nm or more and 800 nm or less is reduced to 15% or less. It is particularly worth noting that a manufacturing method and a manufacturing apparatus, which have such an excellent industrial ability or an excellent mass production ability as to treat such a substrate 20 to be treated capable of significantly reducing the light reflectance in only about five seconds, are produced. Also, it is particularly worth noting that the reflectance is reduced to 15% or less regardless of the presence of a porous layer having as a small thickness as about 500 nm. The reason for this is that when the thickness of the porous layer is small, a particular effect of easily forming a p-n junction is exerted. In the formation of a porous silicon layer using particles of platinum (Pt) or silver (Ag), generally, the thickness of the porous layer is large, and formation of a p-n junction is difficult, and therefore the porous layer is dissolved in an aqueous solution of sodium hydroxide (NaOH) and then the p-n junction is formed. In this case, since the porous layer is eliminated, the reflectance is increased as a result. However, since the porous layer of the present embodiment has a very small thickness, it hardly causes such an adverse effect.

Figure 16:
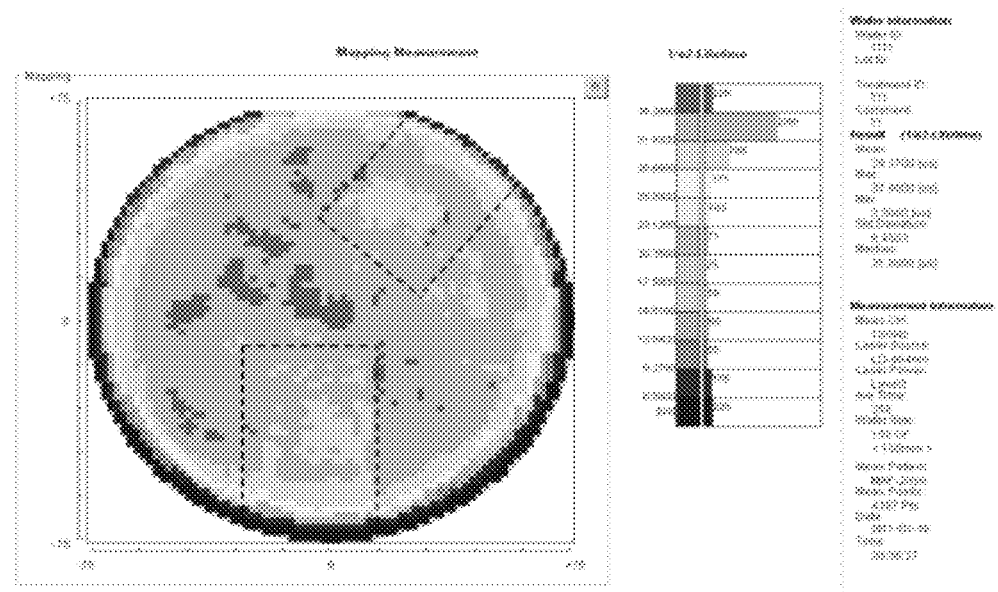
FIG. 16 is a map showing measurements of a lifetime of the substrate to be treated in Sixth Embodiment of the present invention.

Moreover, the present inventor made investigations concerning a carrier lifetime of the surface of the substrate 20 to be treated in the present embodiment. FIG. 16 is a map showing measurements of a lifetime of the substrate 20 to be treated in the present embodiment. In addition, a treatment of the present embodiment was performed on only a region bounded by a dotted line in FIG. 16.

Consequently, although the surface of the substrate 20 to be treated of the present embodiment became porous and the surface area of the substrate increased outstandingly, the rate of decrease in a carrier lifetime was only 10% or less. This particularly worth noting result differs from the result of the surface of the texture structure employed in the transferring substrate 10. For example, in a texture structure employed in the transferring substrate 10, which is formed on the surface of a monocrystalline silicon (100), the rate of decrease in a lifetime is 50% or more since a face having a high interface state density (111) is exposed. On the other hand, it was verified that in the substrate 20 to be treated of the present embodiment, the rate of decrease in a lifetime can be reduced to 10% or less.

Variation Example (1) of Sixth Embodiment

A surface concaved or convexed of a substrate to be treated in the present embodiment is formed by the same manufacturing method as in Sixth Embodiment except that the temperature and the concentration of the process liquid 19 in Sixth Embodiment were changed and the material of the mesh-like transferring member 10b was changed. Therefore, a description duplicating those in First Embodiment, Fifth Embodiment and Sixth Embodiment can be omitted. Herein, in the process liquid 19 of the present embodiment, the concentration of an aqueous hydrofluoric acid solution (HF) is 5.4 M and the concentration of a hydrogen peroxide solution ($H_2O_2$) is 7.2 M. The temperature of the process liquid 19 of the present embodiment is 25° C. Further, the mesh-like transferring member 10b of the present embodiment is the mesh-like transferring member of Fifth Embodiment.

The substrate 20 to be treated was subjected to the same treatment as in Sixth Embodiment under the above-mentioned conditions. In addition, the manufacturing apparatus 51 of a semiconductor device of the present embodiment and a manufacturing method thereof also have such an excellent industrial ability or an excellent mass production ability as to treat such a substrate 20 to be treated in about 5 seconds if the substrate 20 to be treated is a monocrystalline silicon wafer having a diameter of 6 inches as with Sixth Embodiment.

Figure 17:
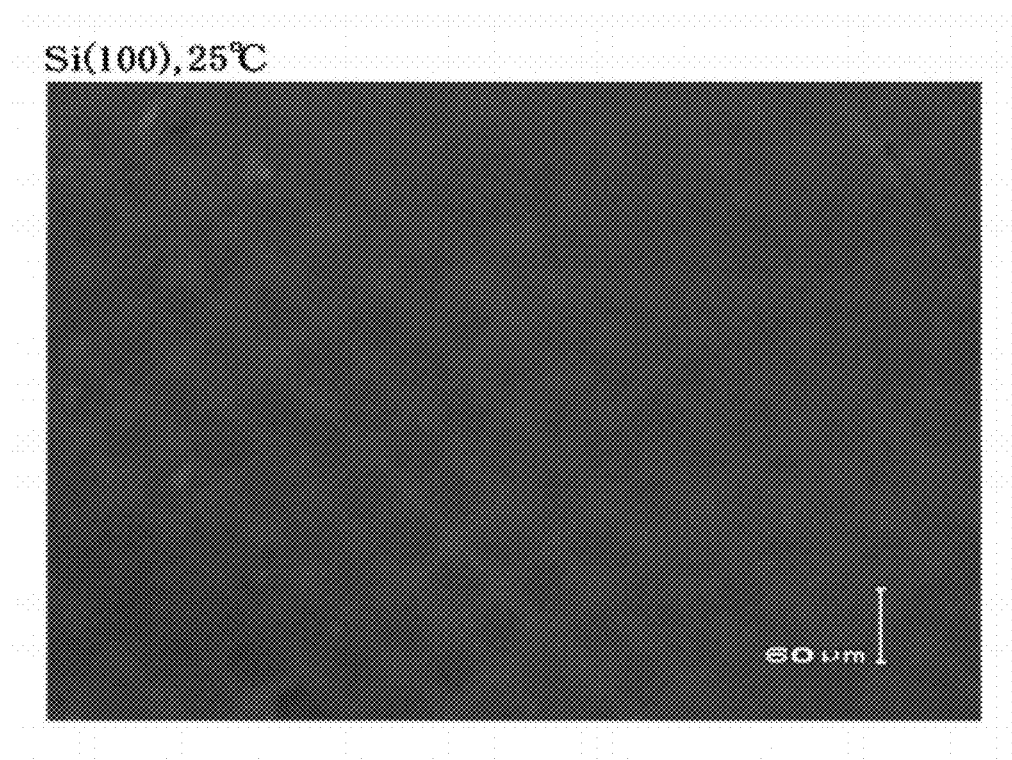
FIG. 17 is an optical micrograph (plane photograph) of a surface of a substrate to be treated in Variation Example (1) of Sixth Embodiment of the present invention.

FIG. 17 is an optical micrograph (plane photograph) of a surface of a substrate 20 to be treated in the present embodiment. As shown in FIG. 17, it was verified that a mesh structure was observed on the surface of the substrate 20 to be treated, but a contrasting density of images in the optical micrograph was very low, and therefore depths of concaves and convexes produced by the transfer of the mesh structure was very shallow. The reason for this is probably that dissolution of silicon proceeded and therefore a part of concaves and convexes reflecting a mesh structure, which were produced by transferring, was dissolved.

Figure 18:
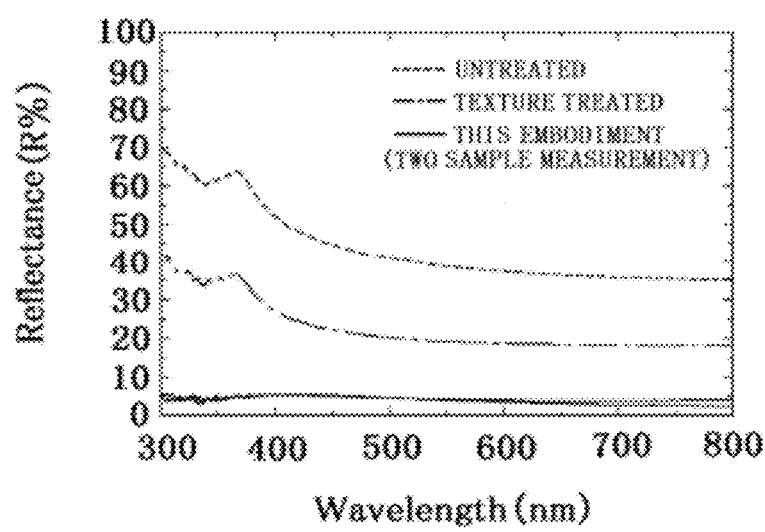
FIG. 18 is a graph describing the reflectance of the surface of the substrate to be treated in Variation Example (1) of Sixth Embodiment of the present invention.

FIG. 18 is a graph describing the reflectance of the surface of the substrate 20 to be treated of the present embodiment. In addition, for comparison, an untreated substrate 20 to be treated and a substrate 20 to be treated provided with a surface of the texture structure employed in the transferring substrate 10 (corresponding to the surface 12 convexed or concaved in FIG. 1) were prepared. In addition, the contents described in FIG. 18 are similar to those in FIG. 15.

As shown in FIG. 18, with respect to the light reflectance of the surface of the substrate 20 to be treated in the present embodiment, it was verified that in the same measuring apparatus as in Sixth Embodiment, the reflectance of light having a wavelength of 300 nm or more and 800 nm or less was significantly lower than any of comparative examples. Moreover, it became evident that the reduction in the reflectance was remarkable even in comparison with the result of Sixth Embodiment. Accordingly, it became evident that by the manufacturing apparatus 51 of a semiconductor device of the present embodiment and a manufacturing method thereof, it is possible to obtain, at room temperature (25° C.), a substrate 20 to be treated in which the reflectance of light having a wavelength of 300 nm or more and 800 nm or less is reduced to 6% or less. In addition, it was found that the surface of the substrate 20 to be treated of the present embodiment also includes a porous layer having a thickness from the surface to about 500 nm depth as with Sixth Embodiment. Accordingly, in the present embodiment, it is also particularly worth noting that the reflectance is reduced to 6% or less regardless of the presence of a porous layer having as a small thickness as about 500 nm.

Variation Example (2) of Sixth Embodiment

A surface concaved or convexed of a substrate to be treated in the present embodiment is formed by the same manufacturing method as in Sixth Embodiment except that a crystal orientation of the substrate 20 to be treated was changed. Therefore, a description duplicating those in First Embodiment, Fifth Embodiment and Sixth Embodiment can be omitted. In addition, the substrate 20 to be treated of the present embodiment is a monocrystalline silicon (111) substrate.

Figure 19:
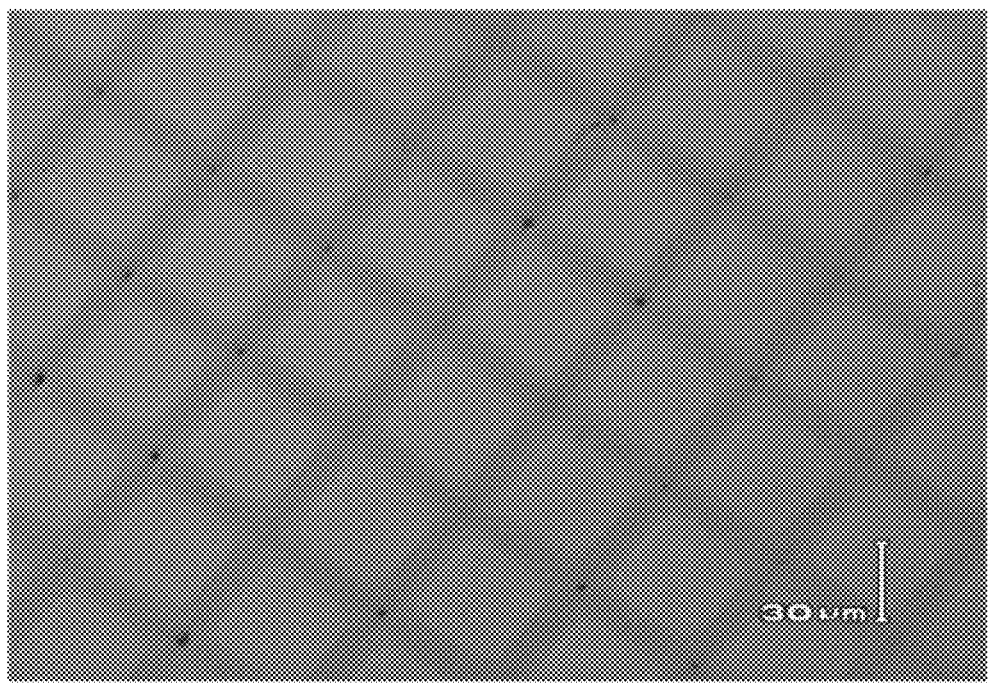
FIG. 19 is an optical micrograph (plane photograph) of a surface of a substrate to be treated in Variation Example (2) of Sixth Embodiment of the present invention.

FIG. 19 is an optical micrograph (plane photograph) of a surface of a substrate 20 to be treated in the present embodiment. It was verified that a similar concave and convex shape is formed even when the crystal orientation is different from that of Sixth Embodiment as shown in FIG. 19. Here, it is particularly worth noting that the manufacturing apparatus of a semiconductor device and a manufacturing method thereof in Sixth Embodiment do not depend on the crystal orientation of a semiconductor substrate. The reason for this is that the texture structure employed in the above-mentioned transferring substrate 10 can be applied to only a monocrystalline silicon substrate having a surface orientation (100), and on the other hand, the manufacturing apparatus 51 of a semiconductor device and a manufacturing method thereof of the present embodiment can be applied without depending on the surface orientation. Moreover, it was found that even when the present embodiment is applied not only to a monocrystalline silicon but also to a polycrystalline silicon, a mesh structure is transferred and a porous surface is formed as with the present embodiment.

Variation Example (3) of Sixth Embodiment

A surface concaved or convexed of a substrate to be treated in the present embodiment is formed by the same manufacturing method as in Sixth Embodiment except that the manufacturing apparatus 51 of a semiconductor device of Sixth Embodiment was changed to a manufacturing apparatus 52 of a semiconductor device. Therefore, a description duplicating those in First Embodiment and Sixth Embodiment can be omitted.

Figure 20:
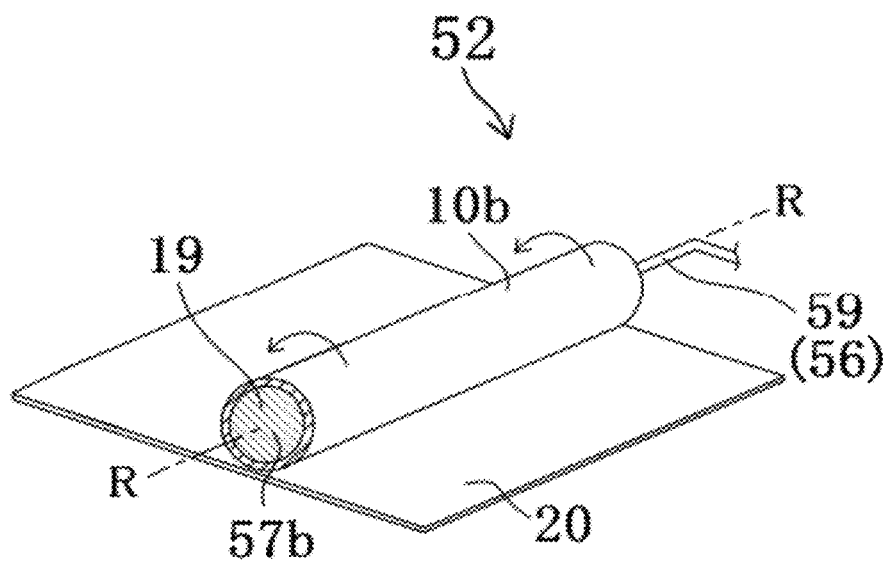
FIG. 20 is a schematic view showing a configuration of a principal part of a manufacturing apparatus of a semiconductor device in Variation Example (3) of Sixth Embodiment of the present invention.

FIG. 20 is a schematic view showing a configuration of a principal part of a manufacturing apparatus 52 of a semiconductor device in the present embodiment. In addition, a mesh shape of the mesh-like transferring member 10b is not drawn for the simplification of the drawing. As shown in FIG. 20, in the manufacturing apparatus 52 of a semiconductor device in the present embodiment, a supply unit 56, which supplies the process liquid 19 to the roll body 57 by using a part of the locating unit 59 as a flow path of the process liquid 19, is employed in place of the supply unit 55 of Sixth Embodiment. Further, the roll body 57b of the present embodiment is composed of a sponge material. Therefore, the roll body 57b maintains a state in which the sponge material is impregnated with the process liquid 19 supplied from the supply unit 56, and can appropriately supply the process liquid 19 to the outside, that is, the mesh-like transferring member 10b side. The same effect as in Sixth Embodiment can be achieved also when the supply unit 56 of the present embodiment is employed. The present embodiment, in which a process liquid is supplied by a sponge-like roll body 57b, is a preferred aspect because by changing the supply rate of the process liquid 19 from a supply unit 56, the degree of pressing of the roll body 57b against the substrate 20 to be treated, or the rotational speed or movement speed of the roll body 57b, the degrees of actions by the process liquid 19 and the mesh-like transferring member 10b can be appropriately adjusted. For specific example, by pressing the mesh-like transferring member 10b of the present embodiment against the surface of the substrate 20 to be treated so that the mesh-like transferring member 10b abuts against the surface for several seconds, the same effect as in Sixth Embodiment can be achieved. Accordingly, in order to treat the entire surface of the substrate 20 to be treated, the roll body 57b may be moved and rotated relative to the surface of the substrate 20 to be treated while maintaining such a state of abutting against the surface for a given length of time.

Figure 21A:
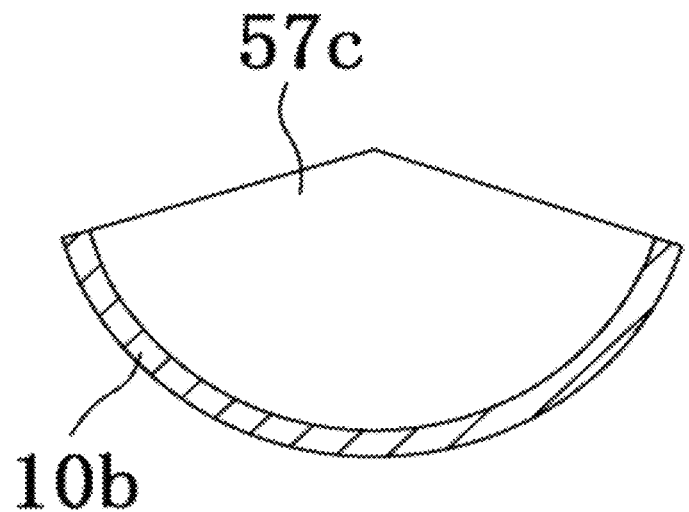
FIG. 21A is a sectional view showing another roll body and another mesh-like transferring member in Sixth Embodiment of the present invention.
Figure 21B:
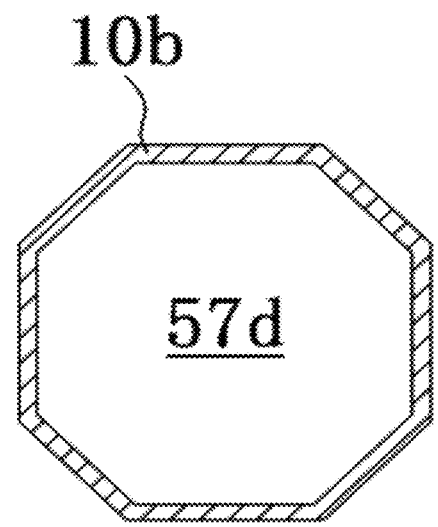
FIG. 21B is a sectional view showing another roll body and another mesh-like transferring member in Sixth Embodiment of the present invention.
Figure 21C:
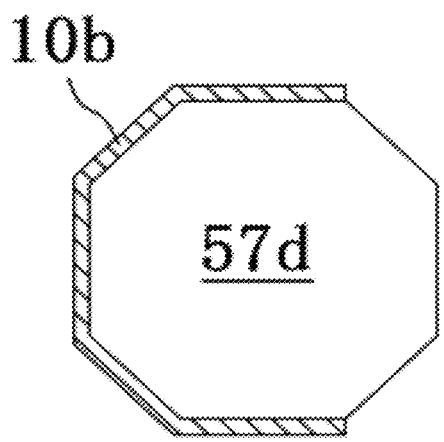
FIG. 21C is a sectional view showing another roll body and another mesh-like transferring member in Sixth Embodiment of the present invention.

In addition, with respect to a shape of the roll body 57a in Sixth Embodiment, and Variation Example (1) of Sixth Embodiment to Variation Example (3) of Sixth Embodiment, a shape of the roll body 57a in a cross-section perpendicular to a rotation axis (line R-R in FIG. 12) was circular, but the shape of the roll is not limited to this shape. For example, even when a roll body 57c, in which a shape in a cross-section perpendicular to its rotation axis is sectoral, and a mesh-like transferring member 10b placed on the peripheral cylindrical surface of the roll body are employed as shown in FIG. 21A, the same effect as in the present embodiment can be achieved. When the sectoral roll body 57c is employed, there is an advantage that a range of degrees through which the roll body 57c is rotated is small. Further, a roll body 57d, in which a shape in a cross-section perpendicular to its rotation axis is polygonal (e.g., octagon shape in FIG. 21B), may be employed in place of the roll body 57a. In order to keep the distance between the roll body 57d and the substrate 20 to be treated constant in rotationally moving the roll body 57d relative to the substrate 20 to be treated, it is preferred that the shape of the roll body 57d in a cross-section perpendicular to its rotation axis is equilateral-polygonal. Further, the shape of the polygon is not limited to an octagonal shape, but a hexagonal shape or a dodecagonal shape may be used as well. Moreover, as shown in FIG. 21C, a structure, in which the mesh-like transferring member 10b is disposed along only a part of the peripheral surface of the roll body 57d, is an aspect which can be employed. Accordingly, the roll body and the mesh-like transferring member are appropriately selected according to the intended use or the area of the substrate 20 to be treated.

Other Embodiments

By the way, the substrate to be treated was a monocrystalline silicon substrate or a polycrystalline silicon substrate in Embodiments described above, but the substrate 20 to be treated is not limited to this. For example, even when the substrate 20 to be treated is a semiconductor substrate such as silicon carbide (SiC), GaAs or InGaAs, the same effect as in Embodiments described above can be achieved. In addition, also the transferring member 10 is not limited to the n-type silicon substrate. For example, even when the substrate 20 to be treated is a silicon substrate other than the n-type silicon substrate, a silicon carbide (SiC) substrate, a metal thin film substrate, a polymer resin or a flexible substrate, the same effects as in Embodiments described above can be achieved.

In Embodiments described above, platinum (Pt) was employed as the catalyst material 17, but the catalyst material 17 is not limited to platinum. For example, as the catalyst material 17, a material, which is at least one selected from the group consisting of silver (Ag), palladium (Pd), gold (Au), rhodium (Rh), ruthenium (Ru), iridium (Ir), and alloys containing at least one of them, and acts as a decomposition catalyst of the oxidizing agent (e.g., hydrogen peroxide) in the process liquid 19, is used. For example, even when the catalyst material is an alloy which is predominantly composed of gold (Au) and contains palladium (Pd) and platinum (Pt), an alloy which is predominantly composed of gold (Au) and contains palladium (Pd), an alloy which is predominantly composed of gold (Au) and contains silver (Ag) and copper (Cu), an alloy which is predominantly composed of gold (Au) and contains silver (Ag), copper (Cu) and palladium (Pd), an alloy of molybdenum (Mo), tungsten (W), iridium (Ir) and platinum (Pt), or an alloy of iron (Fe), cobalt (Co), nickel (Ni) and platinum (Pt), at least a part of the effects of Embodiments described above can be exerted. In addition to this, a small amount of another metal in the above-mentioned catalyst materials may be added. For example, those skilled in the art may appropriately add a proper metal in order to enhance wear resistance or durability.

Moreover, in Sixth Embodiment and Variation Examples of Sixth Embodiment, it is a more preferred aspect to select, as a catalyst material, noble metals less prone to being oxidized by an influence of particularly a high concentration of an oxidizing agent in the process liquid 19, that is, a hydrogen peroxide solution ($H_2O_2$), for example, at least one selected from the group consisting of platinum (Pt), palladium (Pd), rhodium (Rh), gold (Au) and alloys containing them, because catalyst performance is easily maintained. In addition, the meaning of "alloy" in this paragraph is similar to that in description of the above-mentioned catalyst material 17.

In addition to this, a catalyst substance (i.e., catalyst material 17) contributing to promotion of oxidation is not limited the above-mentioned metals. For example, other publicly known catalyst substances including oxide compounds, carbon alloy compounds and inorganic compounds, and various complexes having functions equal to those of the above-mentioned compounds can be employed.

In First Embodiment to Third Embodiment, it is a preferred aspect to interpose an interlayer functioning as a peel-preventive layer to enhance the adhesion like First Embodiment or as an impermeable layer against the process liquid 19 between a matrix substrate (the n-type silicon substrate 11 in First Embodiment) of the transferring member 10 and the catalyst material 17, as required.

Further, in any of Embodiments described above, the aspect, in which the transferring member includes the catalyst material, includes a state in which a film or a layer of the catalyst material is formed on the surface of the transferring member, and a state in which the catalyst material adheres onto the surface of the transferring member in the form of a particle or an island, and includes various aspects in which the catalyst material on the transferring member can develop a function or performance as a catalyst. As a metal serving as the above-mentioned catalyst material 17, typically, a vapor deposition film formed by a publicly known method such as a sputtering method, a plating method or a CVD method, or a film formed by reducing a coat prepared by applying a compound can be employed, but Embodiments described above are not limited to these films.

Further, in Embodiments described above, a mixed aqueous solution of hydrofluoric acid (HF) and a hydrogen peroxide solution ($H_2O_2$) was used as the process liquid 19, but the process liquid 19 is not limited to this mixed aqueous solution. For example, by employing a mixed aqueous solution of hydrofluoric acid (HF) and at least one oxidizing agent selected from the group consisting of a hydrogen peroxide solution ($H_2O_2$), an aqueous solution of potassium dichromate ($K_2Cr_2O_7$), an aqueous solution of potassium manganate ($KMnO_4$), nitric acid ($HNO_3$), sulfuric acid ($H_2SO_4$), and water containing oxygen ($O_2$) or ozone ($O_3$) dissolved therein, as a process liquid 19, at least a part of the effects (e.g., formation of a porous surface) of Embodiments described above is exerted. Further, also when various highly oxidizing solutions or ozone water is employed as an example of the process liquid 19 described above, it is preferred to select noble metals less prone to being oxidized by the process liquid 19 as a catalyst material particularly in Sixth Embodiment and Variation Examples of Sixth Embodiment.

The example of the solar cell 100 in Fourth Embodiment described above can be applied to First Embodiment, Second Embodiment, Fifth Embodiment, Sixth Embodiment, and other Embodiment. Particularly, in Sixth Embodiment and Variation Examples of Sixth Embodiment, since the surface of the substrate 20 to be treated becomes porous, the surface area of the substrate 20 to be treated significantly increases, and the short-circuit current ($J_{SC}$) value which contributes to photoelectric conversion efficiency of a solar cell is improved because of significantly low reflectance of light. Moreover, it is particularly worth noting that a high open voltage ($V_{OC}$) can be attained since reduction in a carrier lifetime is suppressed regardless of outstanding increase in surface area.

Further, the base materials of the mesh-like transferring members 10b employed in Fifth Embodiment, Sixth Embodiment and Variation Examples of Sixth Embodiment are not limited. For example, even when a transferring member prepared by plating an organic polymer material with palladium (Pd) or platinum (Pt) with a nickel plating therebetween was used in place of the above-mentioned mesh-like transferring member 10b, it was verified that the same effects as in the Embodiments described above can be achieved. Accordingly, it was found that treatments in the Embodiments described above can be performed under the conditions under which a mass production ability and an industrial ability are high.

Moreover, as an aspect of another solar cell prepared by applying Sixth Embodiment and Variation Examples of Sixth Embodiment, the following structure can be employed. First, after a shape of a part in the mesh-like transferring member where a mesh of the mesh-like transferring member is not present is formed into a shape of a comb-like (typically, in a plan view) surface electrode of a silicon solar cell commonly employed in advance, treatments in Sixth Embodiment are performed. Then, a convex portion corresponding to the comb-like surface electrode and concave portions reflecting a configuration of the mesh-like transferring member are formed on the surface of a silicon substrate, a substrate 20 to be treated. As a result of this, the concave portion reflecting a configuration of the mesh-like transferring member and a surface around the concave portion become porous, but a surface of the convex portion corresponding to the comb-like surface electrode does not become porous. Thereafter, by forming a silver electrode on the surface of the convex portion corresponding to the comb-like surface electrode by a publicly known technique, a solar cell is prepared. In accordance with such a solar cell, for example, when the substrate to be treated has a flat surface, it becomes easy to form an electrode since a silver electrode can be formed on the flat surface, and on the other hand, in a region other than the electrode, an improvement in the short-circuit current ($J_{SC}$) value and a high open voltage ($V_{OC}$) by virtue of the effect of suppressing reduction in a carrier lifetime can be simultaneously realized.

Further, in any of Embodiments described above, it is another preferred aspect that not only the polycrystalline silicon substrate of Fourth Embodiment, but also a monocrystalline silicon substrate or the above-mentioned amorphous silicon substrate is employed as a substrate 20 to be treated which is employed as a solar cell.

In addition to this, in Fourth Embodiment, Sixth Embodiment and Variation Examples of Sixth Embodiment described above, the solar cell was described as an example of the semiconductor device, but the example of the semiconductor device is not limited to the solar cell. For example, treatments of forming a concave and convex shape by use of the transferring members 10, 10a and 10b in Embodiments described above can also largely contribute to improvements in device performance of a device having a MEMS (Micro Electro Mechanical Systems) structure or a device including a large-scale integrated circuit (LSI). Also, treatments of forming a concave and convex shape by use of the transferring members 10, 10a and 10b in Embodiments described above can also largely contribute to improvements in device performance of semiconductor devices like optical devices such as a light-emitting device and a light-receiving device.

In addition, disclosure of Embodiments described above is described for explanations of these Embodiments, and is not described for limiting the present invention to these Embodiments. In addition, variation examples, including another combination of Embodiments, within the scope of the present invention are also intended to be embraced by the claims.

INDUSTRIAL APPLICABILITY

The present invention can largely contribute to realization of improvement in performance and higher functionality of a substrate to be treated prepared by using a transferring member and hence a semiconductor device manufactured by using the substrate to be treated. Accordingly, the present invention can be used widely in the field of semiconductor devices typified by optical devices such as solar cells, light-emitting devices and light-receiving devices.

The invention claimed is:
1. A method for manufacturing a semiconductor device comprising:
   a supply step of supplying a process liquid that comprises an oxidizing agent and a dissolving agent;
   a locating step of locating a transferring member including a catalyst material at a position in contact with or close to a portion of a surface of a semiconductor substrate, wherein in the locating step, the transferring member is rolled over the portion of the surface and loses a state of at least a part of the transferring member in contact with or close to the portion of the surface and gaining a state of at least a part of the transferring member in contact with or close to another portion of the surface; and
   a concave and convex forming step of forming the surface concaved or convexed or a pore forming step of forming the surface porous through the supply step and the locating step.

2. The method for manufacturing a semiconductor device according to claim 1, wherein the catalyst material is at least one selected from the group consisting of platinum (Pt), silver (Ag), palladium (Pd), gold (Au), rhodium (Rh), ruthenium (Ru), iridium (Ir), and alloys containing at least one of them.

3. The method for manufacturing a semiconductor device according to claim 1, wherein in the locating step, a roll body is moved and rotated relative to the surface of the semiconductor substrate while maintaining a state of locating at least a part of the transferring member disposed along the surface of the roll body in which a shape in a cross-section perpendicular to its rotation axis is circular, polygonal or sectoral at a position in contact with or close to the surface.

4. The method for manufacturing a semiconductor device according to claim 3, wherein the roll body supplies the process liquid.

5. The method for manufacturing a semiconductor device according to claim 1, wherein in the locating step, a roll body is moved and rotated relative to the surface of the semiconductor substrate while maintaining a state of making at least a part of the transferring member disposed along the surface of the roll body made of a sponge material, in which a shape in a cross-section perpendicular to its rotation axis is circular, polygonal or sectoral, abut against the surface.

6. The method for manufacturing a semiconductor device according to claim 1, wherein the process liquid is a mixed aqueous solution of hydrofluoric acid (HF) and at least one oxidizing agent selected from the group consisting of a hydrogen peroxide solution ($H_2O_2$), an aqueous solution of potassium dichromate ($K_2Cr_2O_7$), an aqueous solution of potassium manganate ($KMnO_4$), nitric acid ($HNO_3$), sulfuric acid ($H_2SO_4$), and water containing oxygen ($O_2$) or ozone ($O_3$) dissolved therein.

7. The method for manufacturing a semiconductor device according to claim 1, wherein the catalyst material is a film formed by a sputtering method, a plating method or a CVD method, or a film formed by reducing a coat prepared by applying a compound.

8. The method for manufacturing a semiconductor device according to claim 1, wherein the semiconductor device is a solar cell, an optical device, a device having a MEMS structure or a device including a large-scale integrated circuit (LSI).

9. A manufacturing apparatus of a semiconductor device comprising:
a supply unit for supplying a process liquid that oxidizes and dissolves a semiconductor substrate onto a surface of a semiconductor substrate; and
a locating unit for locating a transferring member, the transferring member including a catalyst material, at a position in contact with or close to a portion of the surface and rolling the transferring member over the surface such that the transferring member loses a state of at least a part of the transferring member being in contact with or close to the portion of the surface and gains a state of locating at least a part of the transferring member at a position in contact with or close to another portion of the surface.

10. The manufacturing apparatus of a semiconductor device according to claim 9, wherein the locating unit includes a roll body, and disposes at least a part of the mesh-like transferring member along a surface of a roll body in which a shape in a cross-section perpendicular to the rotation axis of the roll body is circular, polygonal or sectoral to the surface, and the locating unit moves and rotates the roll body relative to the surface of the semiconductor substrate while maintaining a state of locating the catalyst material at a position in contact with or close to the surface.

11. The manufacturing apparatus of a semiconductor device according to claim 10, wherein the roll body supplies the process liquid.

12. A transferring member for rolling over a portion of a surface of a semiconductor substrate and losing a state of at least a part of the transferring member in contact with or close to the portion of the surface and gaining a state of at least a part of the transferring member in contact with or close to another portion of the surface, wherein the transferring member is a member including a catalyst material, and the transferring member converts the surface of the semiconductor substrate to a surface having a concave and convex or porous shape by locating the catalyst material at a position in contact with or close to the surface of the semiconductor substrate in a state in which a process liquid having an oxidizing agent and a dissolving agent is utilized.

13. A transferring member including a catalyst material that forms concaves and convexes or pores on a surface of a semiconductor substrate by locating the catalyst material at a position in contact with or close to the surface by rolling over a portion of the surface of the semiconductor substrate and losing a Mate of at least a part of the transferring member in contact with or close to the portion of the surface and gaining a state of at least a part of the transferring member in contact with or close to another portion of the surface when a process liquid having an oxidizing property and a dissolving property exists on the surface.

14. The transferring member according to claim 12, wherein the transferring member is disposed along a surface of a roll body in which a shape in a cross-section perpendicular to its rotation axis is circular, polygonal or sectoral.

15. A method of manufacturing a semiconductor device comprising:
bringing a solution that oxidizes and dissolves a semiconductor substrate into contact with a surface of the semiconductor substrate and locating a transferring member including a catalyst material at a position in contact with or close to the surface of the semiconductor substrate so that the catalyst material forms concaves and convexes or pores on the surface, locating the transferring member including a catalyst material at a position in contact with or close to the surface of the semiconductor substrate including rolling the transfer member over the surface and losing a state of locating at least a part of the transferring member in contact with or close to the portion of the surface and gaining a state of locating at least a part of the transferring member at a position in contact with or close to another portion of the surface.

16. The method for manufacturing a semiconductor device according to claim 1, wherein the dissolving agent is a dissolving agent dissolving an oxide.

17. The method for manufacturing a semiconductor device according to claim 1, wherein the dissolving agent is a dissolving agent containing fluoride ions.

18. The transferring member according to claim 12, wherein the dissolving agent is a dissolving agent dissolving an oxide.

19. The transferring member according to claim 12, wherein the dissolving agent is a dissolving agent containing fluoride ions.

20. The manufacturing apparatus of claim 9, wherein the transferring member is a mesh-like transferring member.

* * * * *

UNITED STATES PATENT AND TRADEMARK OFFICE
CERTIFICATE OF CORRECTION

PATENT NO.        : 9,076,916 B2                                    Page 1 of 1
APPLICATION NO.   : 13/578967
DATED             : July 7, 2015
INVENTOR(S)       : Hikaru Kobayashi It is certified that error appears in the above-identified patent and that said Letters Patent is hereby corrected as shown below:

In the claims,

Column 24, Line 25:
"losing a Mate of at least a part of the transferring member" should read, --losing a state of at least a part of the transferring member--.

Signed and Sealed this
First Day of March, 2016

Michelle K. Lee
*Director of the United States Patent and Trademark Office*